United States Patent [19]

Dasse et al.

[11] Patent Number: 5,504,369

[45] Date of Patent: Apr. 2, 1996

[54] APPARATUS FOR PERFORMING WAFER LEVEL TESTING OF INTEGRATED CIRCUIT DICE

[75] Inventors: Edward C. Dasse; Robert W. Bollish; Alfredo Figueroa; James H. Carlquist, all of Austin; Thomas R. Yarbrough, Buda; Charles F. Toewe, Austin; Kelvin L. Holub, Austin; Marcus R. Burton, Dripping Springs; Kenneth J. Long, Austin; Walid S. Ballouli, Austin, all of Tex.

[73] Assignee: Motorola Inc., Schaumburg, Ill.

[21] Appl. No.: 342,960

[22] Filed: Nov. 21, 1994

Related U.S. Application Data

[62] Division of Ser. No. 96,094, Jul. 23, 1993, Pat. No. 5,399,505.

[51] Int. Cl.[6] .................. H01L 21/66; G01R 31/00; G01R 31/28

[52] U.S. Cl. .................. 257/620; 257/48; 257/734; 257/536; 371/21.1; 371/22.5

[58] Field of Search .................. 257/48, 734, 203, 257/202, 204, 786, 620; 371/21.2, 21.1, 21.3, 21.4, 22.5, 22.6

[56] References Cited

U.S. PATENT DOCUMENTS

| | | | |
|---|---|---|---|
| 3,813,650 | 5/1974 | Hunter | 437/51 |
| 4,281,449 | 8/1981 | Ports et al. | 29/293 |
| 4,379,259 | 4/1983 | Varadi et al. | 324/73 |
| 4,467,400 | 8/1984 | Stopper | 361/403 |
| 4,472,483 | 9/1984 | Shimamoto et al. | 428/447 |
| 4,489,397 | 12/1984 | Lee | 364/900 |
| 4,518,914 | 5/1985 | Okubo et al. | 324/158 |
| 4,519,035 | 5/1985 | Chamberlain | 364/200 |
| 4,523,144 | 6/1985 | Okubo et al. | 324/158 |
| 4,628,991 | 12/1986 | Hsiao et al. | 165/80.4 |
| 4,783,695 | 11/1988 | Eichelberger et al. | 357/65 |
| 4,849,847 | 7/1989 | McIver et al. | 361/88 |
| 4,855,253 | 8/1989 | Weber | 437/8 |
| 4,884,122 | 11/1989 | Eichelberger et al. | 357/71 |
| 4,918,811 | 4/1990 | Eichelberger et al. | 29/840 |
| 4,937,203 | 6/1990 | Eichelberger et al. | 437/51 |
| 4,956,602 | 9/1990 | Parrish | 324/158 |
| 4,961,053 | 10/1990 | Krug | 324/158 R |
| 4,967,146 | 10/1990 | Morgan et al. | 324/158 |
| 4,968,931 | 11/1990 | Littlebury et al. | 324/158 |
| 5,012,187 | 4/1991 | Littlebury | 324/158 P |
| 5,047,711 | 9/1991 | Smith et al. | 324/158 R |
| 5,059,899 | 10/1991 | Farnworth et al. | 324/138 |
| 5,089,772 | 2/1992 | Hatada et al. | 324/158 F |
| 5,130,644 | 7/1992 | Ott | 324/58 F |
| 5,206,181 | 4/1993 | Gross | 437/8 |
| 5,208,178 | 5/1993 | Usami | 437/51 |
| 5,239,191 | 8/1993 | Sakumoto et al. | 257/203 |
| 5,241,266 | 8/1993 | Ahmad et al. | 324/158 R |
| 5,279,975 | 1/1994 | Devereaux et al. | 437/8 |
| 5,294,776 | 3/1994 | Furuyama | 219/209 |
| 5,307,010 | 4/1994 | Chiu | 324/158 R |
| 5,389,556 | 2/1995 | Rostoker et al. | 437/8 |

FOREIGN PATENT DOCUMENTS 0308136   11/1993   Japan ........................ 257/786

OTHER PUBLICATIONS

Inter Corporation, Intel486™ DX Microprocessor Data Book, Jun. 1991, pp. 127–141, Order Number: 240440–004.

*Primary Examiner*—Robert P. Limanek
*Assistant Examiner*—Alexander Oscar Williams
*Attorney, Agent, or Firm*—Susan C. Hill

[57] ABSTRACT

A semiconductor wafer (20) having integrated circuit dice (22), wafer conductors (42–47, 50–53), and wafer contact pads (38) formed thereon. The wafer conductors (42–47, 50–53) are used to transfer electrical signals to and from the integrated circuit dice (22) on semiconductor wafer (20) so that wafer level testing and burn-in can be performed on the integrated circuit dice (22). In accordance with one embodiment of the present, each wafer conductor (45, 52) is electrically coupled to the same bonding pad (78) on each integrated circuit dice (22). Each wafer conductor (42–47, 50–53) includes at least a portion of conductor (42–47) which overlies the upper surface of at least one integrated circuit dice (22).

46 Claims, 12 Drawing Sheets

APPARATUS FOR PERFORMING WAFER LEVEL TESTING OF INTEGRATED CIRCUIT DICE

This is a divisional of application Ser. No. 08/096,094, filed Jul. 23, 1993, now U.S. Pat. No. 5,399,505.

FIELD OF THE INVENTION

The present invention relates in general to integrated circuit dice, and more particularly to wafer level testing of integrated circuit dice.

BACKGROUND OF THE INVENTION

Semiconductor manufacturers have the cost saving goal of detecting and screening out defective integrated circuits as early as possible in the manufacturing process. In addition, the requirement of supplying "known good dice" to multi-chip module (MCM) manufacturers has increased the importance of this goal.

During a typical semiconductor manufacturing process, a plurality of integrated circuits are formed as individual dice on a semiconductor wafer. At present, each semiconductor wafer generally has dozens to hundreds of individual dice formed thereon. As integration geometries decrease and the size of semiconductor wafers increase, the number of integrated circuit dice formed on each wafer will most likely increase.

Once the dice are formed on a semiconductor wafer, the dice are then tested to determine which dice are functional and which dice are not functional. In most testing procedures, each die is probed using very costly probe equipment while the dice are still in wafer form. The presently available probe equipment is capable of only testing one or a few dice at a time. The presently available probe equipment contacts each bonding pad on an individual die with a separate probe needle.

While the dice are still in wafer form, each die is probed in order to determine whether each die passes a very basic opens/shorts test (e.g. a test for electrical opens or electrical shorts). In most cases, a full functional test is also performed using the probe equipment. However, no reliability testing is performed because it would be too costly to tie up the probe equipment testing one or a few dice at a time for the hours required for reliability testing.

The purpose of the wafer level probe test is to determine, as early as possible in the manufacturing process, whether each individual die is defective or not. The earlier a defective die is detected, the less money that is wasted on further processing of defective dice.

The dice are then separated or singulated into individual dice using any one of a variety of singulation techniques. In most cases, each die is then packaged in an integrated circuit package. Once the dice have been packaged, thorough electrical testing is performed on each of the packaged integrated circuits. The purpose of the thorough electrical testing is to determine whether each packaged integrated circuit properly performs the functionality specified by the semiconductor manufacturer. The tested, packaged integrated circuits are then sold.

In some cases, the packaged integrated circuits also undergo a reliability testing procedure called burn-in. Burn-in testing involves the testing of an integrated circuit for an extended period of time while the temperature of the integrated circuit is elevated above room temperature. In some cases, the heat generated by the integrated circuit itself is sufficient to elevate the temperature of the integrated circuit. In other cases, the temperature of the integrated circuit is raised by an apparatus external to the integrated circuit (e.g. a burn-in oven in which the packaged integrated circuits are placed).

Alternately, instead of or in addition to burn-in testing, cold temperature reliability testing may be performed. Cold temperature reliability testing involves the testing of an integrated circuit for an extended period of time while the temperature of the integrated circuit is decreased below room temperature.

Semiconductor manufacturers spend a significant amount of money packaging defective dice which pass the testing performed during probing, but which do not pass the reliability testing after packaging. In addition, the probe testing is redundant in that the same electrical tests are again performed on the individual integrated circuits after packaging.

The cost saving goal of detecting and screening out defective dice as early as possible in the manufacturing process is especially important in the context of multi-chip modules (MCMs). Multi-chip modules (MCMs) are electronic modules that include a plurality of integrated circuit dice which are packaged together as one unit. Multi-chip modules are becoming more widely used.

For multi-chip modules, it is quite costly to replace one or more failed dice once the dice have been bonded onto a substrate. Therefore, it is desirable to determine whether or not a die is fully functional and is reliable before the die is packaged as part of a multi-chip module. In addition, many manufacturers of multi-chip modules are requiring that semiconductor manufacturers sell them fully tested "known good dice" which have passed reliability tests and which are not packaged in an integrated circuit package.

SUMMARY OF THE INVENTION

The previously mentioned needs are fulfilled and other advantages achieved with the present invention. In one form, the present invention comprises a method and apparatus for performing wafer level testing. In an alternate form, the present invention comprises a method and apparatus for providing a semiconductor substrate. In an alternate form, the present invention comprises a method and apparatus for fabricating and testing a plurality of integrated circuits.

In one form, the present invention comprises a semiconductor wafer. The semiconductor wafer has a semiconductor substrate which has an upper major surface. The semiconductor wafer also has a plurality of integrated circuit dice which have an upper surface. The plurality of integrated circuit dice are formed on the semiconductor substrate. The semiconductor wafer has a wafer conductor. The wafer conductor is electrically coupled to a first one of the plurality of integrated circuit dice. At least a portion of the wafer conductor is formed overlying the upper surface of a second one of the plurality of integrated circuit dice. Electrical contact can be made to the first one of the plurality of integrated circuit dice by way of the wafer conductor for purposes of testing.

The present invention will be understood by one skilled in the art from the detailed description below in conjunction with the accompanying drawings.

DESCRIPTION OF THE PREFERRED EMBODIMENTS

Overview

The present invention can be used to perform wafer level testing of integrated circuit dice. By performing thorough reliability tests on integrated circuit dice while in wafer form, semiconductor manufacturers can detect and screen out potentially all defective dice right after the dice have been manufactured, rather than after costly packaging has been performed. In addition, by performing thorough reliability testing on integrated circuit dice while in wafer form, semiconductor manufacturers can meet the requirements of multi-chip module (MCM) manufacturers by supplying "known good dice". The present invention can also be used to perform thorough electrical testing in a more cost efficient manner than the presently available probe equipment.

Figure 2:
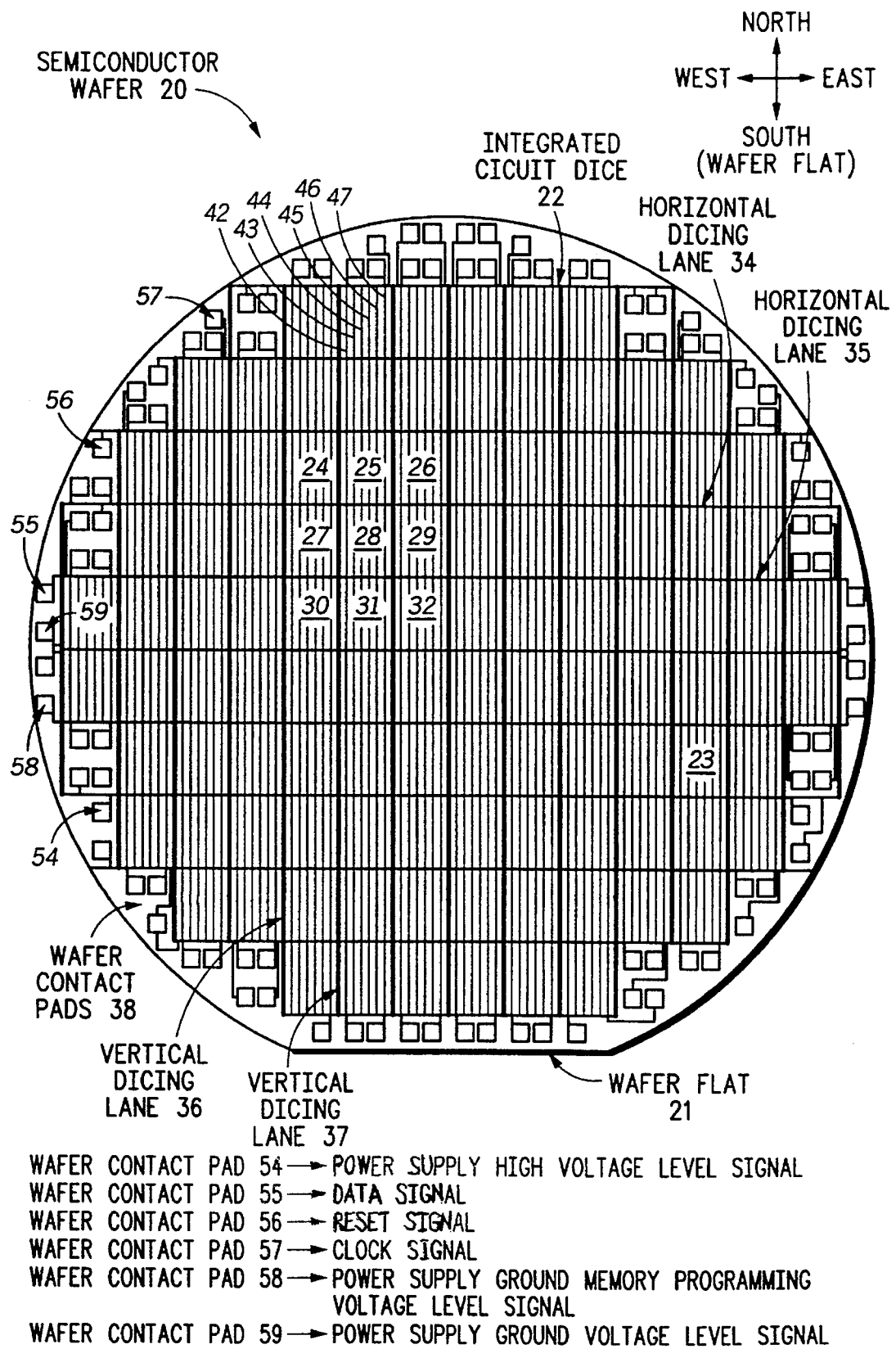
FIG. 2 illustrates a top view of a semiconductor wafer in accordance with one embodiment of the present invention.

In performing wafer level testing of integrated circuit dice, the present invention utilizes wafer conductors which are formed at least partially overlying the integrated circuit dice themselves. Referring to FIG. 2, vertical conductors 42–47 overlie integrated circuit dice 25, 28, and 31; and each vertical conductor 42–47 is a portion of a wafer conductor. One embodiment of the present invention illustrated in FIG. 2 has six separate wafer conductors for transferring six different electrical signals; and each of the six wafer conductors includes a plurality of horizontal conductors and a plurality of vertical conductors.

The wafer conductors in the present invention are electrically insulated from the underlying integrated circuit dice by an insulating layer, except at selected locations where each wafer conductor is electrically coupled to each integrated circuit dice. These wafer conductors can then be used to transfer voltage levels to the integrated circuit dice, such as power and ground. In addition, these wafer conductors can be used to transfer signals which can be used to test the integrated circuit dice.

Thus by using these wafer conductors to transfer signals to, and possibly from, the integrated circuit dice, it is possible to test the integrated circuit dice in wafer form. By allowing wafer conductors to be formed overlying the integrated circuit dice, the entire area of a semiconductor wafer is now available for the routing of wafer conductors for wafer level testing. This is a significant advantage.

Semiconductor manufacturers have the goal of maximizing the number of integrated circuit dice on a wafer in order to maximize profits. Unfortunately, in the prior art, any test conductors or test circuitry were limited to the unused periphery of the wafer near the wafer flat, and to the narrow dicing lanes which separated the integrated circuit dice. If more area was needed in the prior art, then the number of integrated circuit dice on the wafer had to be reduced in order to provide more space for the test conductors and test circuitry. However, reducing the number of integrated circuit dice formed on each wafer reduced profits.

The present invention does not require that the number of dice formed on the wafer be reduced or that the dicing lanes be enlarged. The present invention can still make use of the unused periphery of the die and the narrow dicing lanes; but in addition, the present invention can use the area overlying the integrated circuits, which is the vast majority of the area on most wafers. After wafer level testing of the integrated circuit dice has been completed, the wafer conductors are no longer needed and may be completely removed, partially removed, or left in place, depending upon the particular embodiment.

Of course it is very important that additional processing steps performed on a semiconductor wafer do not reduce the yield or degrade the reliability of the integrated circuit dice. The yield is the percentage of integrated circuit dice on a wafer which are fully functional. For example, if there are 100 integrated circuit dice on a wafer, and 90 are fully functional, then the yield for that wafer is 90%. The reliability of the integrated circuit dice is determined by the number of integrated circuit dice which are initially fully functional, but which fail over the course of time and usage. Reliability of integrated circuit dice can be measured in a variety of ways. In the present invention, the depositing, etching, and removal of a significant number of metal conductors overlying the integrated circuit dice has not been found to reduce the yield or degrade the reliability of the integrated circuit dice.

There are two broad categories of electrical tests which can be performed on an integrated circuit die. The first category is functional tests. Functional tests are used to verify the logical functionality of the die independent of timing, AC characteristics, current and voltage levels, or other parametric values associated with the integrated circuit die. The second category is parametric tests. Parametric test are used to measure integrated circuit die characteristics over a continuous range of inputs parameters, such as voltage, current, timing, etc.

Unfortunately, performing the full range of electrical tests on an integrated circuit die does not guarantee that the integrated circuit die will continue to function properly. It is common to have integrated circuit dice which function properly for a short period of time and then fail. This problem is commonly called "infant mortality". Some integrated circuit dice have circuitry which is particularly susceptible to infant mortality. In addition, some integrated circuit dice contain non-volatile memory circuitry which requires long data retention periods, to determine if the memory cells function properly.

In order to screen out integrated circuit dice which will fail due to infant mortality, reliability testing is performed. Reliability testing is electrical testing which is performed over an extended period of time. Burn-in testing is reliability testing which is performed at elevated temperatures. The reliability tests can include any combination of functional and parametric tests.

Detailed Description of the Preferred Embodiments

Figure 1:
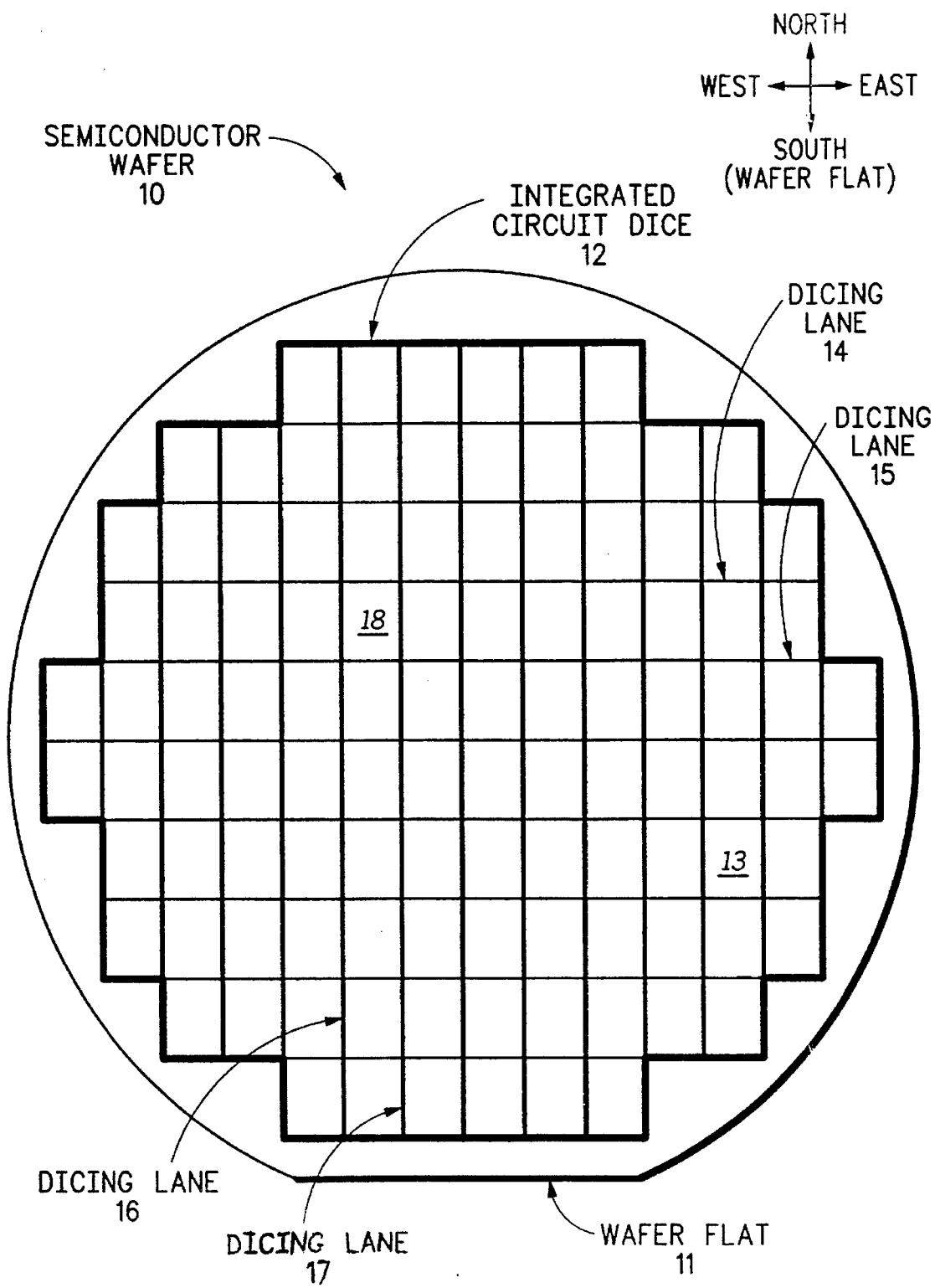
FIG. 1 illustrates a top view of a semiconductor wafer in accordance with the prior art.

FIG. 1 illustrates a semiconductor wafer 10 in accordance with the prior art. Semiconductor wafer 10 has a plurality of integrated circuit dice 12 which are formed thereon. The plurality of integrated circuit dice 12 are arranged in a plurality of rows and columns which are separated by a plurality of dicing lanes, such as horizontal dicing lanes 14–15 and vertical dicing lanes 16–17. Integrated circuit die 13 and integrated circuit die 18 are each one of the integrated circuit dice 12.

The directionality indicators north, south, east, and west have been added to FIGS. 1–5 to help orient one figure with respect to another figure. East-west lines are considered to be parallel to the wafer flat 11, and north-south lines are considered to be perpendicular to the wafer flat 11.

FIG. 2 illustrates a semiconductor wafer 20 in accordance with one embodiment of the present invention. Semiconductor wafer 20 has a plurality of integrated circuit dice 22 which are formed thereon. The plurality of integrated circuit dice 22 are arranged in a plurality of rows and columns which are separated by a plurality of dicing lanes, such as horizontal dicing lanes 34–35 and vertical dicing lanes 36–37. Integrated circuit die 23–32 are each one of the integrated circuit dice 22. The plurality of integrated circuit dice 22 may or may not be identical to each other. In one embodiment of the present invention, each of the plurality of integrated circuit dice 22 is a data processor.

Integrated circuit die 28 illustrated in FIG. 2 has the same die location as integrated circuit die 18 illustrated in FIG. 1. Likewise, integrated circuit die 23 illustrated in FIG. 2 has the same die location as integrated circuit die 13 illustrated in FIG. 1. Die location is determined by an integrated circuit die's physical location on a wafer. Die location can be described in a variety of ways. For example, each integrated circuit die on a wafer can be given a unique identifier, such as a sequential number or column and row coordinates which correspond to one particular integrated circuit die location on each wafer.

A plurality of wafer contact pads 38 are located around the periphery of semiconductor wafer 20. Wafer contact pads 54–59 are each one of the wafer contact pads 38. Wafer contact pads 54–59 are each coupled to a different wafer conductor, and each wafer conductor transfers a different electrical signal.

In one embodiment of the present invention, wafer contact pad 54 is electrically coupled to a wafer conductor which conducts a power supply high voltage level signal; wafer contact pad 55 is electrically coupled to a wafer conductor which conducts a data signal; wafer contact pad 56 is electrically coupled to a wafer conductor which conducts a reset signal; wafer contact pad 57 is electrically coupled to a wafer conductor which conducts a clock signal; wafer contact pad 58 is electrically coupled to a wafer conductor which conducts a power supply memory programming voltage level signal; and wafer contact pad 59 is electrically coupled to a wafer conductor which conducts a power supply ground voltage level signal.

The remaining wafer contact pads 38 are redundant wafer contact pads. The minimum number of wafer contact pads required in one embodiment of the present invention is six, namely wafer contact pads 54–59. However, for increased reliability and signal integrity, multiple wafer contact pads are usually coupled to the same wafer conductor. Thus if the electrical coupling between one wafer contact pad and its corresponding wafer conductor is weak or faulty, the electrical coupling between a different wafer contact pad and the same wafer conductor can still be used to transfer a signal to or from wafer 20.

In addition, it may be useful to have redundant wafer contact pads coupled to a wafer conductor which is used to conduct a significant amount of current, such as the wafer conductor which conducts a power supply high voltage level signal. In some embodiments, a plurality of redundant wafer contact pads may be required in order to provide signal integrity across the semiconductor wafer, for example, by reducing voltage drops to an acceptable level. Note that the redundant wafer contact pads are used in parallel with each other. Unlike redundant memory cells, a redundant wafer contact pad is used in addition to other wafer contact pads, not instead of another wafer contact pad.

In one embodiment of the present invention, the wafer contact pads 38 and the wafer conductors are made of a single metal layer, such as aluminum. In an alternate embodiment of the present invention, the wafer contact pads 38 and the wafer conductors are made of a plurality of stacked metal layers formed one on top of the other, such as titanium, tungsten, and copper. In alternate embodiments of the present invention, the wafer contact pads 38 and the wafer conductors can be made of any appropriate conductive material. The wafer contact pads 38 and the wafer conductors can be made of the same conductive material or materials, or can be made of different conductive materials.

In addition, in some embodiments of the present invention, one or more wafer contact pads 38 can be formed overlying an integrated circuit die 22, or overlying a partial integrated circuit die (not shown). For example, the four wafer contact pads 38 located at each end of the row containing integrated circuit dice 27, 28, and 29 may be formed overlying an integrated circuit die 22, or overlying a partial integrated circuit die (not shown). In one embodiment of the present invention, any integrated circuit die 22 which has one or more wafer contact pads 38 overlying it is sacrificed and is not used in an end product due to the physical pressure placed on the integrated circuit die 22 during testing. In alternate embodiments of the present invention, the wafer contact pads 38 could be located anywhere on semiconductor wafer 20, not just in the periphery around the outer edge of semiconductor wafer 20.

In some embodiments of the present invention, the plurality of integrated circuit dice 22 (see FIG. 2) are identical to each other. In alternate embodiments of the present invention, the plurality of integrated circuit dice 22 may vary from each other in a manner which allows each die to be individually located on the semiconductor wafer. For example, each integrated circuit die 22 may have a unique identification code.

Figure 3:
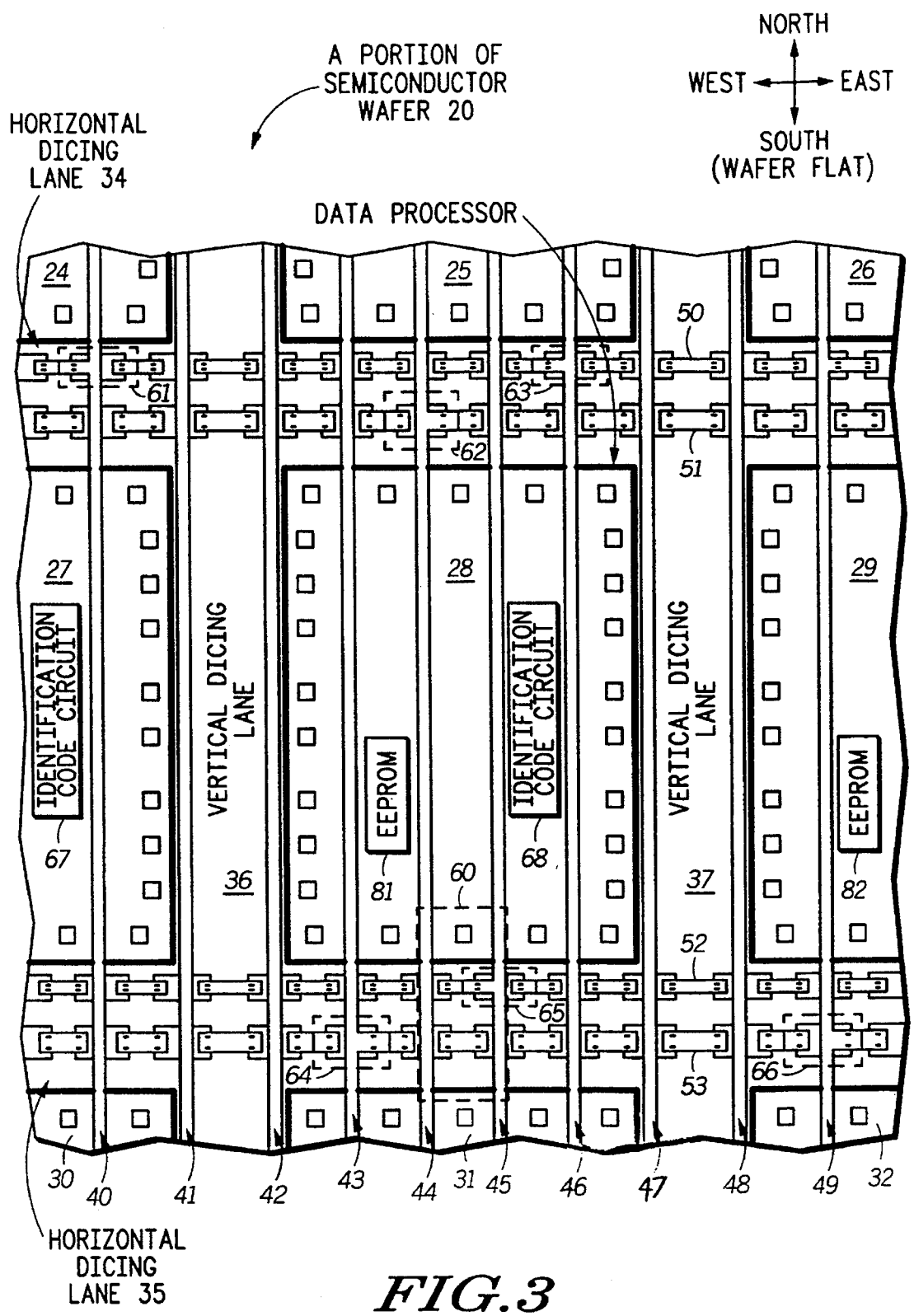
FIG. 3 illustrates a portion of the semiconductor wafer illustrated in FIG. 2, in accordance with one embodiment of the present invention.

Referring to FIG. 3, integrated circuit die 27 may have an identification code circuit 67 which stores a unique identification code, and integrated circuit die 28 may have an identification code circuit 68 which stores a different identification code. A one-to-one mapping can then be made between each unique identification code and each available die location on the semiconductor wafer. The identification code circuits 67 and 68 may be identical except for the identification code which they store.

In some embodiments of the present invention, the identification code circuits 67 and 68 may include non-volatile memory cells (not shown) such as read only memory (ROM) cells. There are a variety of ways to program these ROM cells with a different identification code for each integrated circuit die 22. In one embodiment, a different pattern on the processing mask is used for each integrated circuit die 22 during the processing step which programs the ROM. Each of the different patterns programs the ROM on each integrated circuit die 22 with a different identification code. One disadvantage to this approach is that a significant number of different patterns are required to be formed on one mask.

In an alternate embodiment of the present invention, a programmable light source can be used as part of the stepper apparatus which exposes the photoresist during the manufacture of integrated circuit dice 22. The non-volatile memory cells on integrated circuit dice 22 can be aligned with the programmable light source on the stepper apparatus so that the programmable light source can be used to selectively program the non-volatile memory cells. For example, by exposing five non-volatile memory cells to light, the circuit connections can be made such that those five memory cells are programmed to a logic level one. And by not exposing three different non-volatile memory cells to light, the circuit connections can be made such that those three cells are programmed to a logic level zero. In this manner, each integrated circuit die 22 may be programmed with a unique identification code, without the need for different programming patterns on a mask.

The directionality indicators north, south, east, and west have been added to FIGS. 1–5 to help orient one figure with respect to another figure. East-west lines are considered to be parallel to the wafer flat 21, and north-south lines are considered to be perpendicular to the wafer flat 21.

FIG. 3 illustrates a portion of semiconductor wafer 20 of FIG. 2. The particular portion of semiconductor wafer 20 illustrated in FIG. 3 includes integrated circuit die 28, and portions of integrated circuit dice 24–27 and 29–32. In one embodiment of the present invention, vertical conductors 40–49 run the full length of a column of integrated circuit dice. A vertical conductor may overlie one, several, or all integrated circuit dice in a column. For example, vertical conductor 40 overlies all of the dice in a first column, including dice 24, 27, and 30; vertical conductors 43–46 overlie all of the dice in a second column, including dice 25, 28, 31; and vertical conductor 49 overlies all of the dice in a third column, including dice 26, 29, and 32. Alternately, a vertical conductor may be placed in a vertical dicing lane (e.g. vertical conductors 41–42 are placed in vertical dicing lane 36, and vertical conductors 47–48 are placed in vertical dicing lane 37).

Note that FIG. 2 illustrates an embodiment in which six vertical conductors overlie each integrated circuit dice in a column, and FIG. 3 illustrates an embodiment in which two of the six vertical conductors are place in the vertical dicing lanes. Alternate embodiments of the present invention may have any number of vertical conductors overlying the integrated circuit dice and may have any number of vertical conductors placed in the vertical dicing lanes. However, the advantage to placing all of the vertical conductors so that they overlie integrated circuit dice is that the vertical dicing lanes are left available for various other circuitry and patterns which have normally filled the available space in the dicing lanes.

Thus in alternate embodiments of the present invention, none of the vertical conductors may be formed in the vertical dicing lanes, but instead, all of the vertical conductors may be formed overlying integrated circuit die. In the embodiment of the present invention illustrated in FIG. 3, the vertical dicing lanes would have to be expanded in order to fit all of the required vertical conductors in the dicing lanes. It is undesirable to expand the width of the dicing lanes because the extra semiconductor area required for the dicing lanes may require that the number of dice formed on the wafer be reduced.

In one embodiment of the present invention, horizontal conductors 50–51 are placed in horizontal dicing lane 34 and run almost the entire width of wafer 20. Likewise, horizontal conductors 52–53 are placed in horizontal dicing lane 35 and run almost the entire width of wafer 20. In alternate embodiments of the present invention, one or more horizontal conductors may overlie each integrated circuit die in a row, as long as provision is made so that the vertical conductors and the horizontal conductors are electrically coupled only at selected interconnect points.

Semiconductor region 61 outlines an area in horizontal dicing lane 34 in which vertical conductor 40 is electrically coupled to horizontal conductor 50. Semiconductor region 62 outlines an area in horizontal dicing lane 34 in which vertical conductor 44 is electrically coupled to horizontal conductor 51. Semiconductor region 63 outlines an area in horizontal dicing lane 34 in which vertical conductor 46 is electrically coupled to horizontal conductor 50. Semiconductor region 64 outlines an area in horizontal dicing lane 35 in which vertical conductor 43 is electrically coupled to horizontal conductor 53. Semiconductor region 65 outlines an area in horizontal dicing lane 35 in which vertical conductor 45 is electrically coupled to horizontal conductor 52. Semiconductor region 66 outlines an area in horizontal dicing lane 35 in which vertical conductor 49 is electrically coupled to horizontal conductor 53.

In one embodiment of the present invention, vertical conductor 42 (see FIG. 3) is a portion of the wafer conductor which is electrically coupled to wafer contact pad 54 (see FIG. 2) and which conducts a power supply high voltage level signal. Vertical conductor 43 is a portion of the wafer conductor which is electrically coupled to wafer contact pad 55 and which conducts a data signal. Vertical conductor 44 is a portion of the wafer conductor which is electrically coupled to wafer contact pad 56 and which conducts a reset signal. Vertical conductor 45 is a portion of the wafer conductor which is electrically coupled to wafer contact pad 57 and which conducts a dock signal. Vertical conductor 46 is a portion of the wafer conductor which is electrically coupled to wafer contact pad 58 and which conducts a power supply memory programming voltage level signal. Vertical conductor 47 is a portion of the wafer conductor which is electrically coupled to wafer contact pad 59 and which conducts a power supply ground voltage level signal.

In addition, in one embodiment of the present invention, vertical conductor 40 (see FIG. 3) is a portion of the wafer conductor which is electrically coupled to wafer contact pad 58 (see FIG. 2) and which conducts a power supply memory programming voltage level signal. Vertical conductor 41 is a portion of the wafer conductor which is electrically coupled to wafer contact pad 59 and which conducts a power supply ground voltage level signal. Vertical conductor 48 is a portion of the wafer conductor which is electrically coupled to wafer contact pad 54 and which conducts a power supply high voltage level signal. Vertical conductor 49 is a portion of the wafer conductor which is electrically coupled to wafer contact pad 55 and which conducts a data signal.

Thus in one embodiment of the present invention, a wafer conductor includes one or more vertical conductors and one or more horizontal conductors. Each wafer conductor is then coupled to one or more wafer contact pads 38.

Semiconductor region 60 is a portion of the semiconductor wafer 20 illustrated in FIG. 2 and FIG. 3. Semiconductor region 60 is illustrated in more detail in FIG. 4. An alternate embodiment of semiconductor region 60, namely semiconductor region 60', is illustrated in more detail in FIG. 5.

Figure 4:
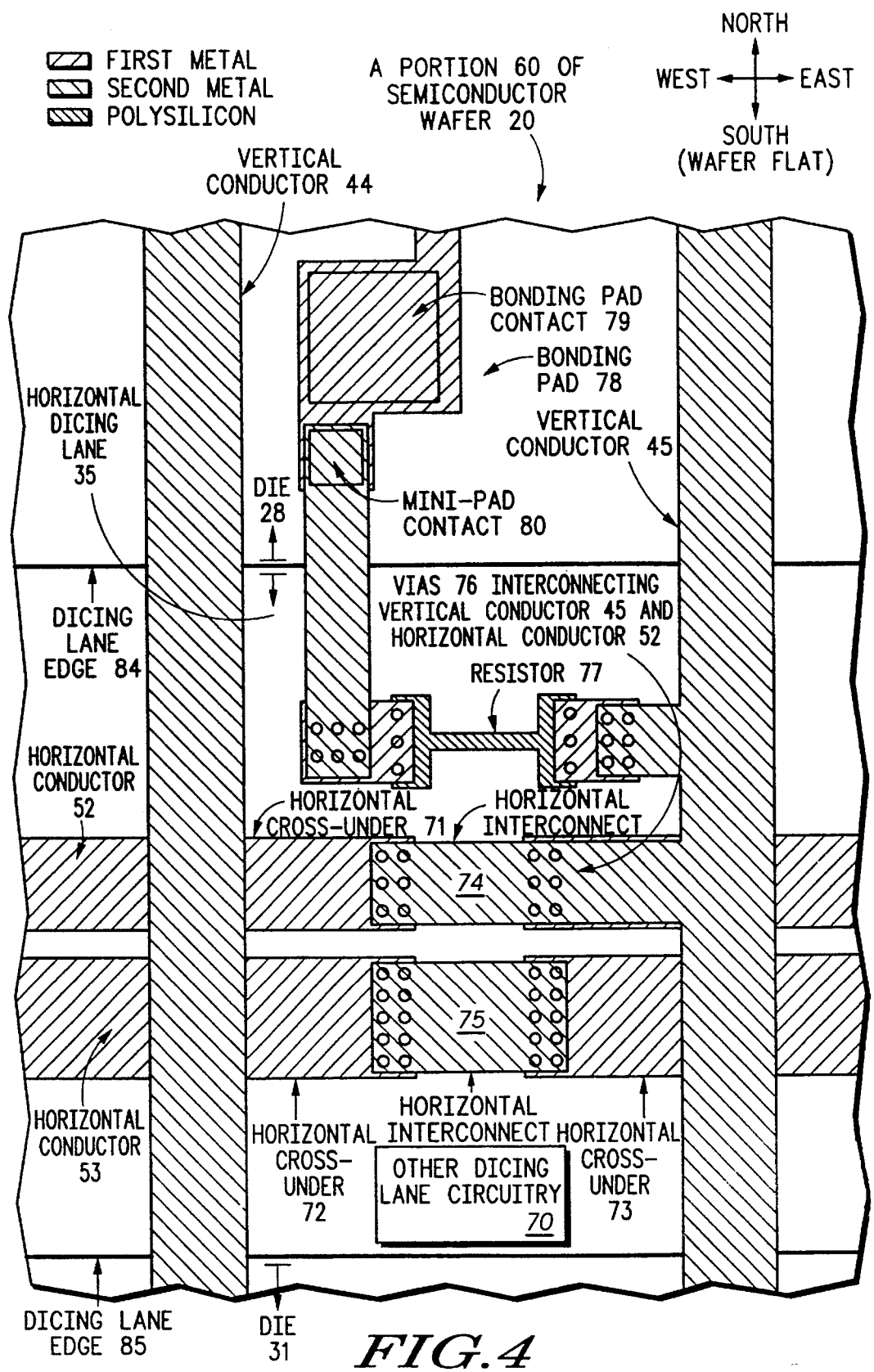
FIG. 4 illustrates a sub-portion of the portion of the semiconductor wafer illustrated in FIG. 3, in accordance with one embodiment of the present invention.

FIG. 4 illustrates a region or a portion 60 of semiconductor wafer 20 (see FIGS. 2–3). Dicing lane edge 84 separates integrated circuit die 28 from horizontal dicing lane 35. Dicing lane edge 85 separates integrated circuit die 31 from horizontal dicing lane 35. Horizontal conductors 52–53 are formed in dicing lane 35. Horizontal conductor 52 includes horizontal cross-under 71 and horizontal interconnect 74. Horizontal conductor 53 includes horizontal cross-under 72, horizontal interconnect 75, and horizontal cross-under 73.

Horizontal conductor 52 crosses under vertical conductor 44 by way of horizontal cross-under 71; thus horizontal conductor 52 and vertical conductor 44 are not electrically coupled in region 60. An insulating layer (not shown) lies between horizontal conductor 52 and vertical conductor 44. This insulating layer (not shown) prevents electrical contact between the first metal layer and the second metal layer unless vias or contacts have been etched in the insulating layer.

Horizontal conductor 53 crosses under vertical conductor 44 by way of horizontal cross-under 72; thus horizontal conductor 53 and vertical conductor 44 are not electrically coupled in region 60. An insulating layer (not shown) lies between horizontal conductor 53 and vertical conductor 44.

Horizontal conductor 53 crosses under vertical conductor 45 by way of horizontal cross-under 73; thus horizontal conductor 53 and vertical conductor 45 are not electrically coupled in region 60. An insulating layer (not shown) lies between horizontal conductor 53 and vertical conductor 45.

Vias 76 are used to electrically couple vertical conductor 45 and horizontal conductor 52. The vias 76 are contacts formed through an insulating layer (not shown) which lies between vertical conductor 45 and horizontal conductor 52.

Other dicing lane circuitry 70, located in dicing lane 35, includes a variety of circuitry known in the prior art which may be useful to include on wafer 20. For example, other dicing lane circuitry 70 may include test patterns which can be used to determine parametrics at various locations across wafer 20. In addition, other dicing lane circuitry 70 may include alignment patterns which are used to properly align wafer 20 during the manufacturing process. Other dicing lane circuitry 70 may be spread throughout the horizontal and vertical dicing lanes on wafer 20. Other dicing lane circuitry 70 does not include any circuitry or test patterns which are required to practice the present invention.

In some embodiments of the present invention, a resistor is used to protect against excessive current flow between a wafer conductor and a bonding pad. For example, in FIG. 4, resistor 77 is electrically coupled between bonding pad 78 on integrated circuit die 28, and the wafer conductor which includes vertical conductor 45. In one embodiment of the present invention, resistor 77 serves a current limiting function. In an alternate embodiment of the present invention, resistor 77 serves the function of a fuse. Alternate embodiments of the present invention may use other methods for isolating one or more faulty, shorted dice from a wafer conductor.

As an example, integrated circuit die 28 could be defective because bonding pad 78 is unintentionally shorted to a power supply high voltage level. In an embodiment using a current limiting resistor, such as resistor 77, the current limiting resistor will remain intact and serve to limit the current flow to or from integrated circuit die 28. Thus current limiting resistor 77 will prevent faulty integrated circuit die 28 from causing a significant voltage drop. As a result, current limiting resistor 77 ensures that the voltage level of the wafer conductor does not vary significantly from the intended voltage level.

In an embodiment using resistor 77 as a fuse, the excessive current flow through the high resistance polysilicon resistor 77 will cause polysilicon resistor 77 to be destroyed. In an embodiment using a resistive element as a fuse, an open circuit will be formed between bonding pad 78 and the wafer conductor. Thus resistor 77 will create an open circuit between integrated circuit die 28 and the wafer conductor which includes vertical conductor 45 when the current flow through resistor 77 exceeds a predetermined maximum current limit. The predetermined maximum current limit can be varied by varying the resistance and physical characteristics of resistor 77.

In the embodiment using resistor 77 as a fuse, resistor 77 breaks the electrical coupling between a wafer conductor and a bonding pad if the current flow is too great. Resistor 77 thus protects other integrated circuit dice which are coupled to the same wafer conductor from being damaged by an excessive current flow.

In one embodiment of the present invention, a resistive element is used each time a wafer conductor is coupled to a bonding pad. Alternate embodiments of the present invention may use other approaches to ensure that excessive current due to one or more defective integrated circuit dice does not harm the remaining non-defective dice.

Note that in one embodiment of the present invention, only six wafer conductors are required in order to perform wafer level testing. Thus only six bonding pads on each integrated circuit die 22 (see FIG. 2) need to be electrically coupled to a wafer conductor. Thus, although each integrated circuit die 22 may have a large number of bonding pads, only a few of the bonding pads on each integrated circuit die must be electrically coupled to a wafer conductor. For example, in one embodiment of the present invention, each of the plurality of integrated circuit dice 22 is a data processor, having dozens of individual bonding pads. In this embodiment, only a small percentage of the bonding pads on each integrated circuit die 22 must be electrically coupled to a wafer conductor.

In some embodiments of the present invention, each integrated circuit die 22 has one or more redundant bonding pads for certain signals, for example, signals such as power and ground. In these embodiments, one or more of these redundant bonding pads may be coupled to the same wafer conductor in order to improve reliability and to supply the same electrical signal to multiple bonding pads on each integrated circuit die 22.

Referring to FIG. 4, in one embodiment of the present invention the bonding pads which are coupled to a wafer conductor, such as bonding pad 78, include two separate contacts, namely bonding pad contact 79 and mini-pad contact 80. The advantage to using mini-pad contact 80 is that the bonding pad 78 can be electrically coupled to a wafer conductor without having to disturb bonding pad contact 79. Thus bonding pad contact 79 remains protected by an overlying insulating layer (not shown) during reliability testing and burn-in. Thus an etch process step which is used to remove the wafer conductor (e.g. an etch process step to remove second layer metal) will not undercut the bonding pad contact 79. In some embodiments of the present invention, bonding pad contact 79 is electrically coupled to a wire-bond wire when integrated circuit die 28 is packaged.

Although the embodiment of the present invention illustrated in FIG. 4 shows the vertical conductors being formed from second layer metal and the horizontal conductors being formed from both first and second layer metal, alternate embodiments of the present invention may use any appropriate combination of conductive layers to form the wafer conductors. In addition, although the illustrated embodiment shows the wafer conductors as being formed using only vertical conductors and the horizontal conductors, alternate embodiments of the present invention may use diagonal conductors, or even conductors which snake in various directions across wafer 20.

Alternate embodiments of the present invention may segment wafer 20 into a plurality of wafer segments. For example, referring to FIG. 2, all of the integrated circuit dice west of vertical dicing lane 36 may be part of a first wafer segment, and all of the integrated circuit dice east of vertical dicing lane 36 may be part of a second wafer segment. Each wafer segment may have its own set of wafer conductors. That is, a first set of wafer conductors used to transfer test signals to the first wafer segment may not be the same as and may not be electrically coupled to the second set of wafer conductors used to transfer test signals to the second wafer segment. The signals transferred by the first set of wafer conductors may even be different than the signals transferred by the second set of wafer conductors.

Figure 5:
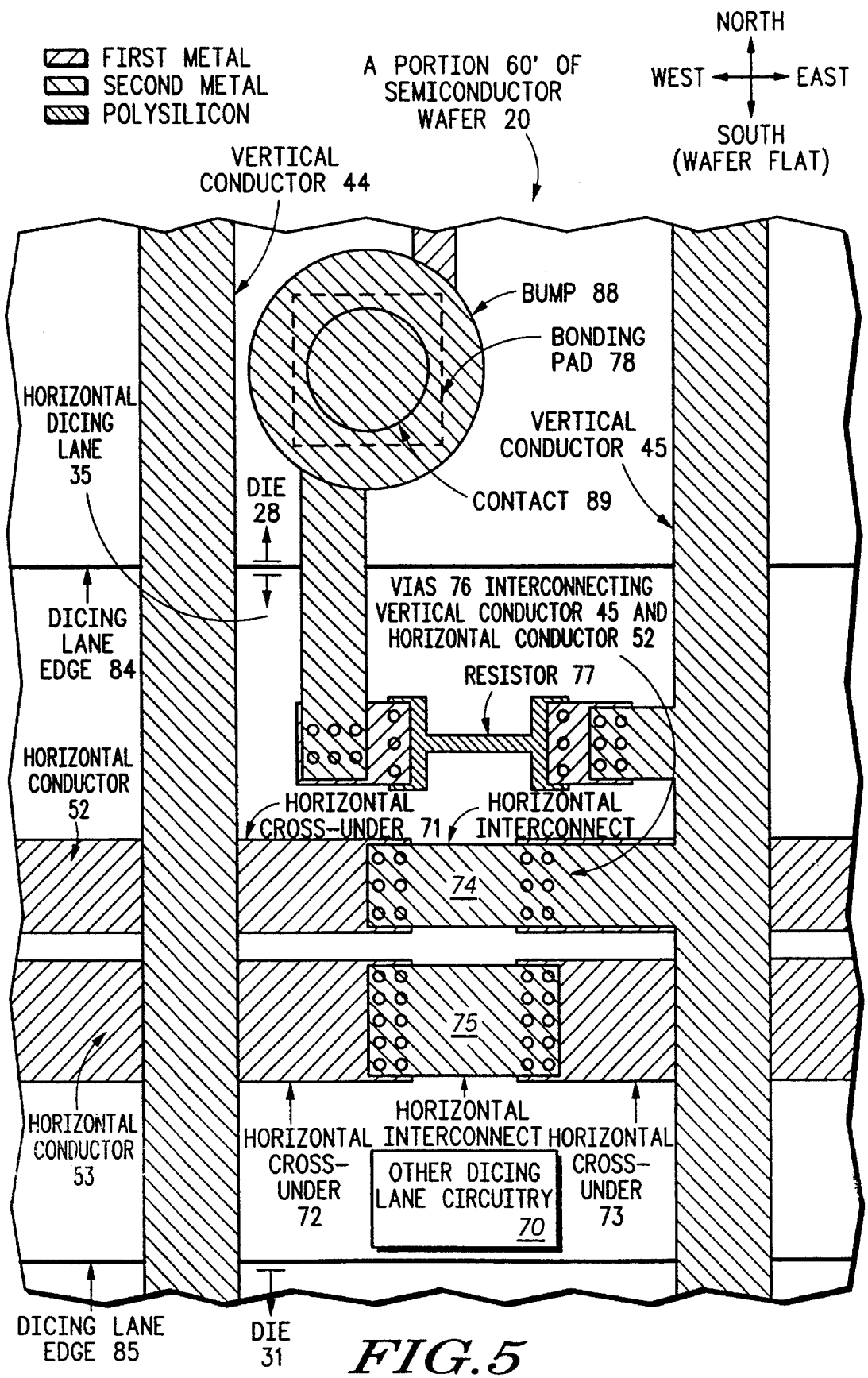
FIG. 5 illustrates a sub-portion of the portion of the semiconductor wafer illustrated in FIG. 3 in accordance with an alternate embodiment of the present invention.

FIG. 5 illustrates a region or a portion 60' of semiconductor wafer 20. FIG. 5 is an alternate embodiment of semiconductor region 60 of FIG. 3. FIG. 5 is the same as FIG. 4 with the exception of the bonding pad area. FIG. 5 illustrates the use of a metal bump 88 as the bonding pad 78. Contact 89 in FIG. 5 serves a similar function as bonding pad contact 79 in FIG. 4. Contact 89 is used to electrically couple the circuitry on integrated circuit die 28 to the wafer conductor which includes vertical conductor 45.

Referring to FIG. 5, wire-bond wires are not used when integrated circuit die 28 is packaged. Instead, bump 88 is used to make direct contact to a board level conductor, such as a conductor on a printed circuit board. Note that the differences between FIG. 4 and FIG. 5 have to do with the implementation of the bonding pad area on the integrated circuit dice. The present invention can be used with a wide variety of bonding pad implementations. The manner in which a wafer conductor is coupled to an integrated circuit die depends upon the particular implementation.

Figure 6:
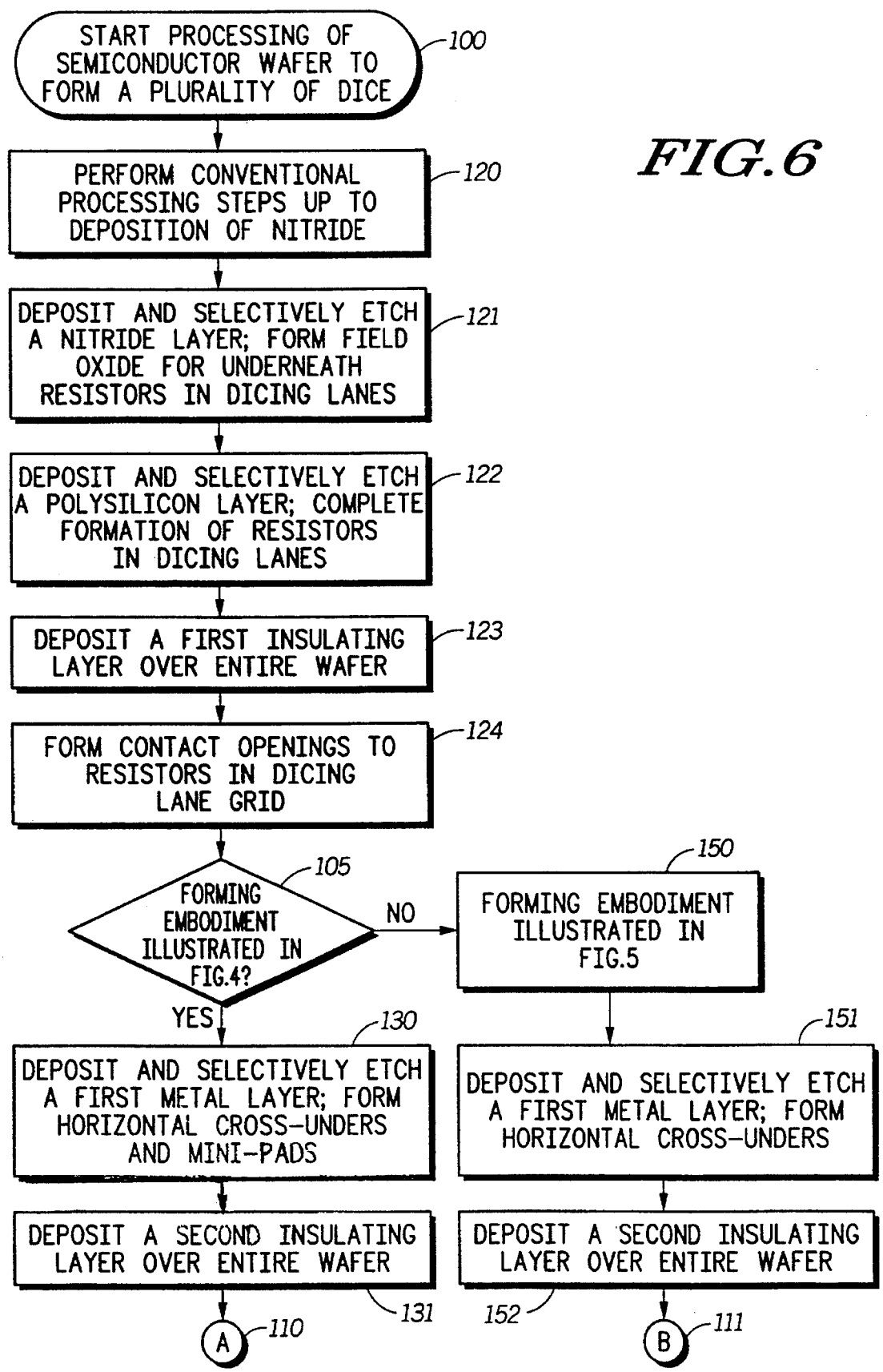
FIGS. 6–8 illustrate, in flow diagram form, a method of forming a semiconductor wafer in accordance with one embodiment of the present invention.
Figure 7:
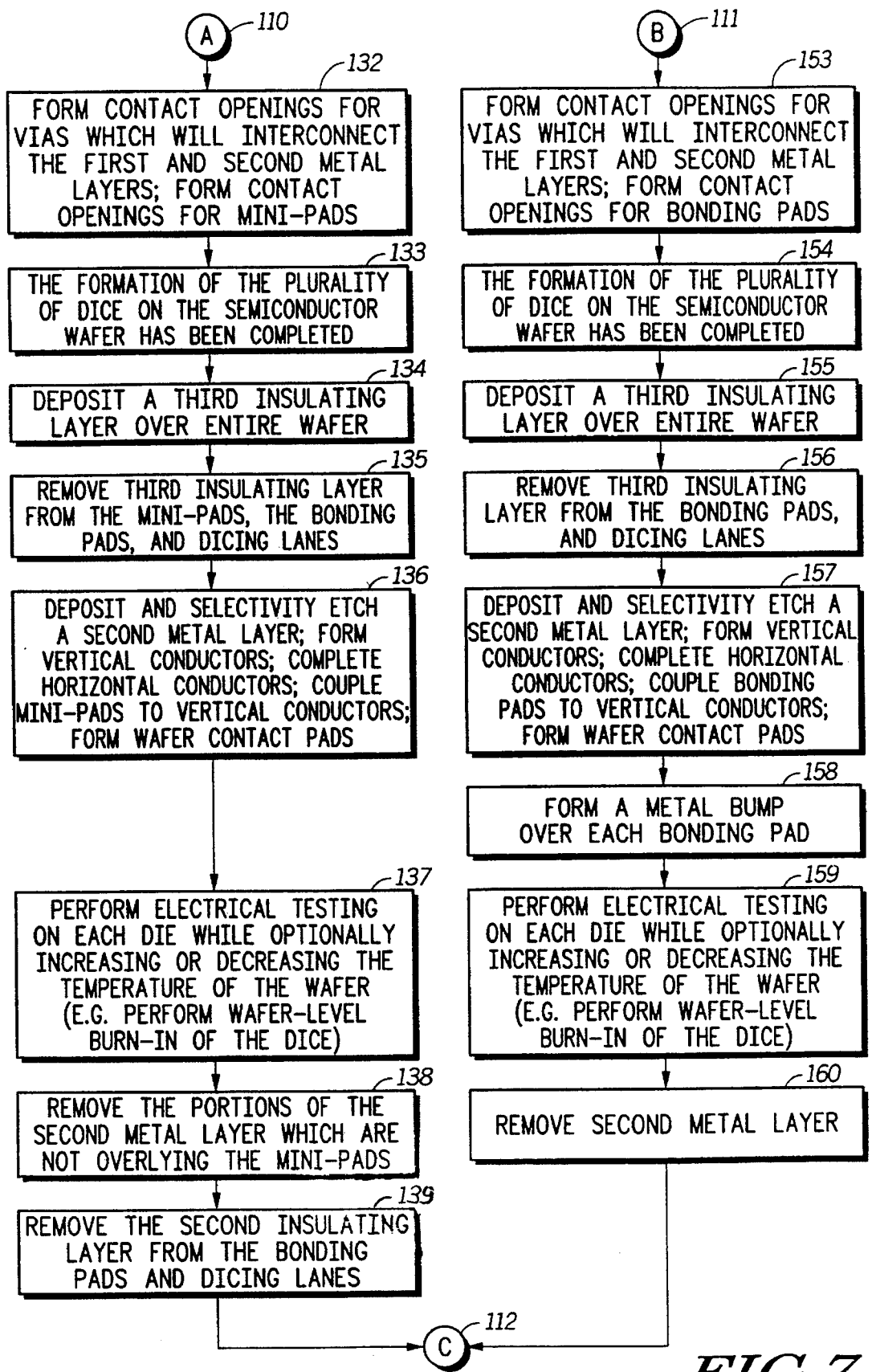
Figure 8:
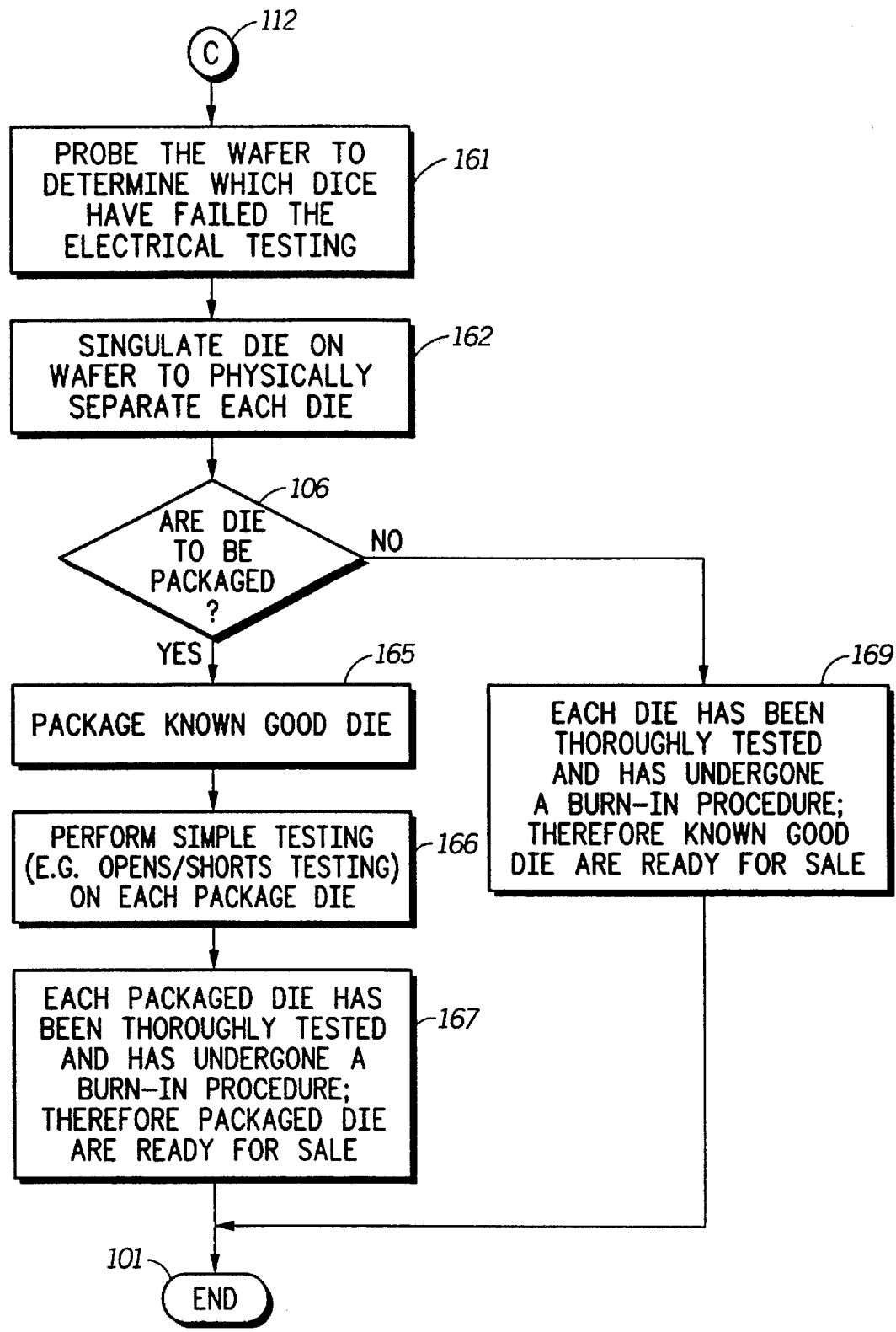

FIGS. 6–8 illustrate, in flow diagram form, a method of forming a semiconductor wafer in accordance with one embodiment of the present invention. Oval 100 represents a starting point for the flow diagram, and oval 101 represents an ending point for the flow diagram. Diamonds 105 and 106 represent decisions points which affect the subsequent path that is taken in the flow diagram.

Rectangles 120–124 represent steps which are performed at the beginning of the flow diagram. Note that the steps indicated by rectangle 120, namely "performing processing steps up to the deposition of nitride", are the same processing steps that are performed to manufacture the prior art wafer 10 illustrated in FIG. 1. Although most of the steps described in FIGS. 6–8 are also performed to manufacture the prior art wafer 10 (see FIG. 1), most of the steps have been modified to form the elements required by the present invention. For example, the prior art includes a step similar to rectangle 122 in which polysilicon is deposited and selectively etched to form circuitry on the integrated circuit dice. However, in the prior art, polysilicon resistors such as resistor 77 in FIG. 4 were not formed.

Rectangles 130–139 represent steps which are performed in order to form the embodiment of the present invention which is illustrated in FIG. 4. Rectangles 150–160 represent steps which are performed in order to form the embodiment of the present invention which is illustrated in FIG. 3. Rectangles 161–162, rectangles 165–167, and rectangle 169 represent steps which are performed after the integrated circuit dice have been electrically tested. Circles 110–112 represent particular points in the process flow.

In one embodiment of the present invention, an additional mask is required in order to selectively etch the second metal layer. However, because the geometries required for this second metal layer are so large, this is an inexpensive addition to the processing costs. In this same embodiment, only minor modifications are required to existing masks in order to form the remaining elements used by the present invention. In addition, because the geometries required for this second metal layer are so large, the probability of defects in the formation of wafer conductors, wafer contact pads, vias, etc. is very small. Defects formed during processing will rarely be large enough to cause an erroneous open or a short in the wafer conductors and wafer contact pads.

Unlike the first metal layer, the second metal layer is not used to form any of the circuitry on integrated circuit dice 22. The second metal layer is an additional layer of metal which is deposited and patterned using conventional metallization processes after the circuitry on integrated circuit dice 22 has been fully formed. In alternate embodiments of the present invention, this second metal layer can be formed of any sufficiently conductive material which can be selectively deposited, or deposited and etched using conventional techniques.

In one embodiment of the present invention, a projection printer or a proximity printer was used to pattern the second metal layer on semiconductor wafer 20. Thus the entire semiconductor wafer 20 was exposed at the same time using one mask for the entire wafer. In this embodiment of the present invention, the geometries of the wafer conductors and wafer contact pads 38 are very large (e.g. tens of microns) in comparison to the geometries of the circuitry on the integrated circuit dice 22 (e.g. fractions of microns).

One particular example of the present invention will now be discussed. Referring to FIGS. 4 and 6–8, in one embodiment of the present invention, the steps up to and including the step illustrated in rectangle 133 used conventional semiconductor processing materials and procedures which did not need to be modified in order to practice the present invention. Although the masks used incorporated modifications for the present invention, (e.g. to form resistor 77), the processing procedures and parameters (e.g. thicknesses, temperatures, etc.) remained unchanged up to and including the step illustrated in rectangle 133.

In one embodiment of the present invention, the steps illustrated in rectangles 134–135 include the following steps. First, one thousand nanometers of phosphorus doped silicon dioxide (PSG) are deposited over the entire wafer using plasma enhanced chemical vapor deposition (PECVD). Then the PSG overlying a portion of the other dicing lane circuitry 70 (see FIG. 4), the PSG overlying the vias to second metal, such as vias 76, and the PSG overlying each mini-pad contact 80 are removed using conventional masking and etching techniques. A portion of the other dicing lane circuitry 70 is then tested using probe equipment.

Next, fifty-five hundred nanometers of polyimide are deposited over the entire wafer using conventional spin coating techniques. The polyimide overlying the dicing lanes (e.g. dicing lanes 34–37 in FIG. 2), overlying each mini-pad contact 80 (see FIG. 4), and overlying each bonding pad contact 79 is then removed by optically exposing and developing the polyimide using conventional techniques. The third insulating layer has now been deposited and subsequently removed from the selected areas.

In this same embodiment of the present invention, the step illustrated in rectangle 136 includes the following steps. Two thousand nanometers of aluminum alloy are deposited over the entire wafer using conventional sputtering techniques. In one embodiment, the aluminum alloy is approximately 98% aluminum, approximately 1% silicon, and approximately 1% copper. The aluminum alloy is then removed from selected areas using conventional photolithographic patterning and etching techniques. The aluminum alloy is not used to form any of the circuitry within integrated circuit dice 22.

In this same embodiment of the present invention, the step illustrated in rectangle 137 includes thorough reliability testing of all of the integrated circuit dice 22 while the temperature of semiconductor wafer 20 is elevated to approximately one hundred twenty-five degrees centigrade for approximately six hours.

In this same embodiment of the present invention, the step illustrated in rectangle 138 includes the following steps. The portions of the second metal layer overlying the mini-pad contacts, such as mini-pad contact 80 (see FIG. 4), are masked using conventional photolithographic patterning techniques. Then the second metal layer is removed using conventional etching techniques. The purpose of masking the area overlying the mini-pad contacts (e.g. mini-pad contact 80) is to protect the first layer metal forming the bonding pads (e.g. bonding pad 78) and to protect the integrated circuit die 22 from the entry of contamination. The masking prevents the first layer metal forming the bonding pads from being undercut by the etching step used to remove the second layer metal.

In one embodiment of the present invention, the same conductive layer (e.g. second layer metal in FIGS. 4 and 5) which is used to form the majority of the wafer conductors may be used to program the non-volatile memory cells (not shown) in the identification code circuits (e.g. 67 and 68 in FIG. 3) on each integrated circuit die 22. The second layer metal used to program the non-volatile memory cells in the identification code circuits can then be masked and protected from the etch used to remove the second layer metal. The portion of second layer metal used to program the non-volatile memory cells can be protected from the second layer metal etch in the same manner as the portion of second layer metal overlying mini-pad contact 80.

Note that in an alternate embodiment of the present invention, PSG may be the only insulating material deposited for the third insulating layer; polyimide may not be used. Alternate embodiments of the present invention may use any appropriate insulating material or combination of insulating materials. Alternate embodiments of the present invention may use any appropriate conductive material or combination of conductive materials to form the wafer conductors and wafer contact pads 38.

Alternate embodiments of the present invention may use fewer, more, or different steps than those illustrated in FIGS. 6–8. For example, alternate embodiments of the present invention may use fewer, more, or different processing steps than those illustrated in FIGS. 6–8 to form the wafer conductors and to couple the wafer conductors to the integrated circuit dice 22.

Figure 9:
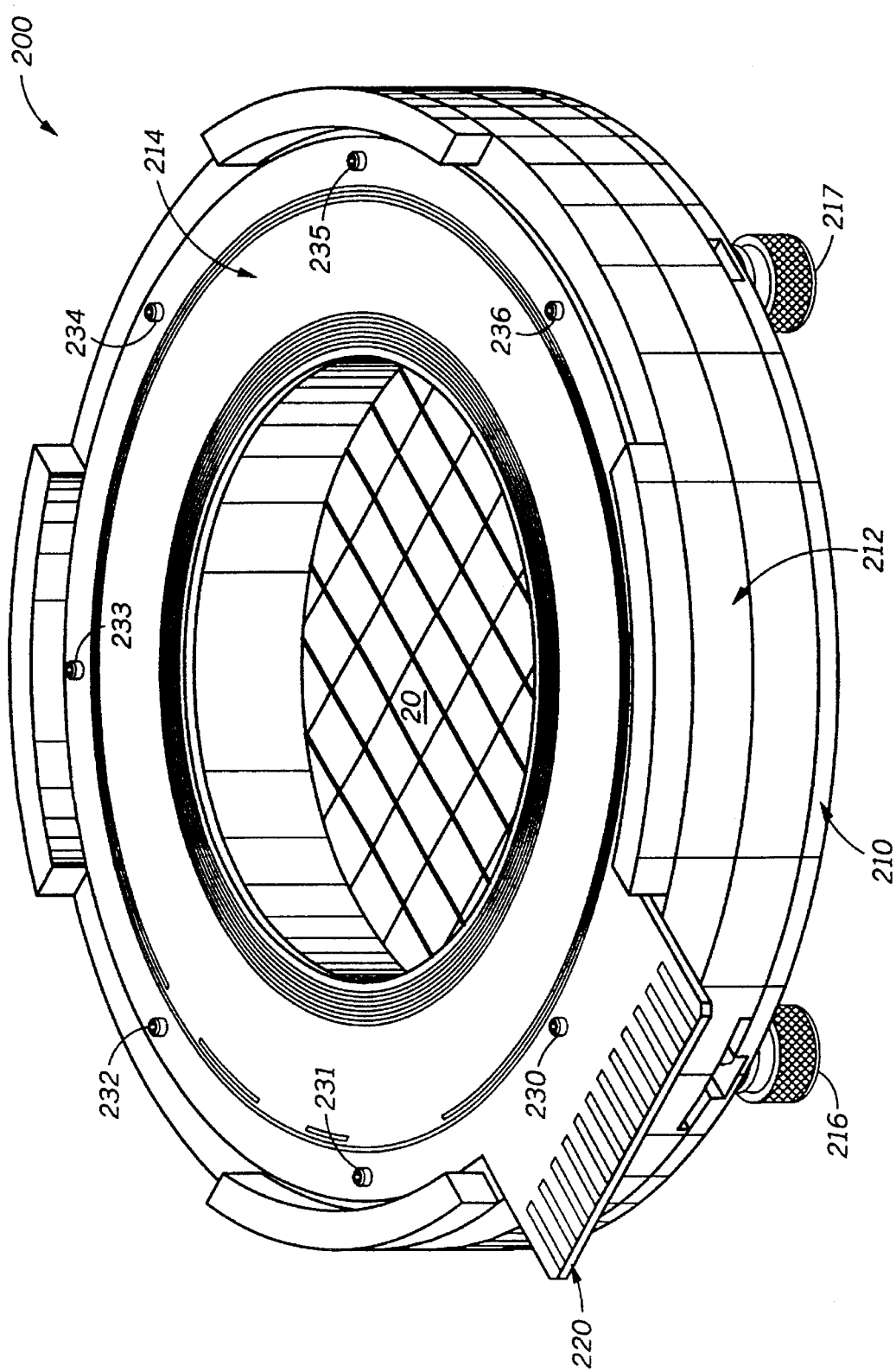
FIG. 9 illustrates a three-quarters view of an apparatus for performing wafer level testing in accordance with one embodiment of the present invention.
Figure 12:
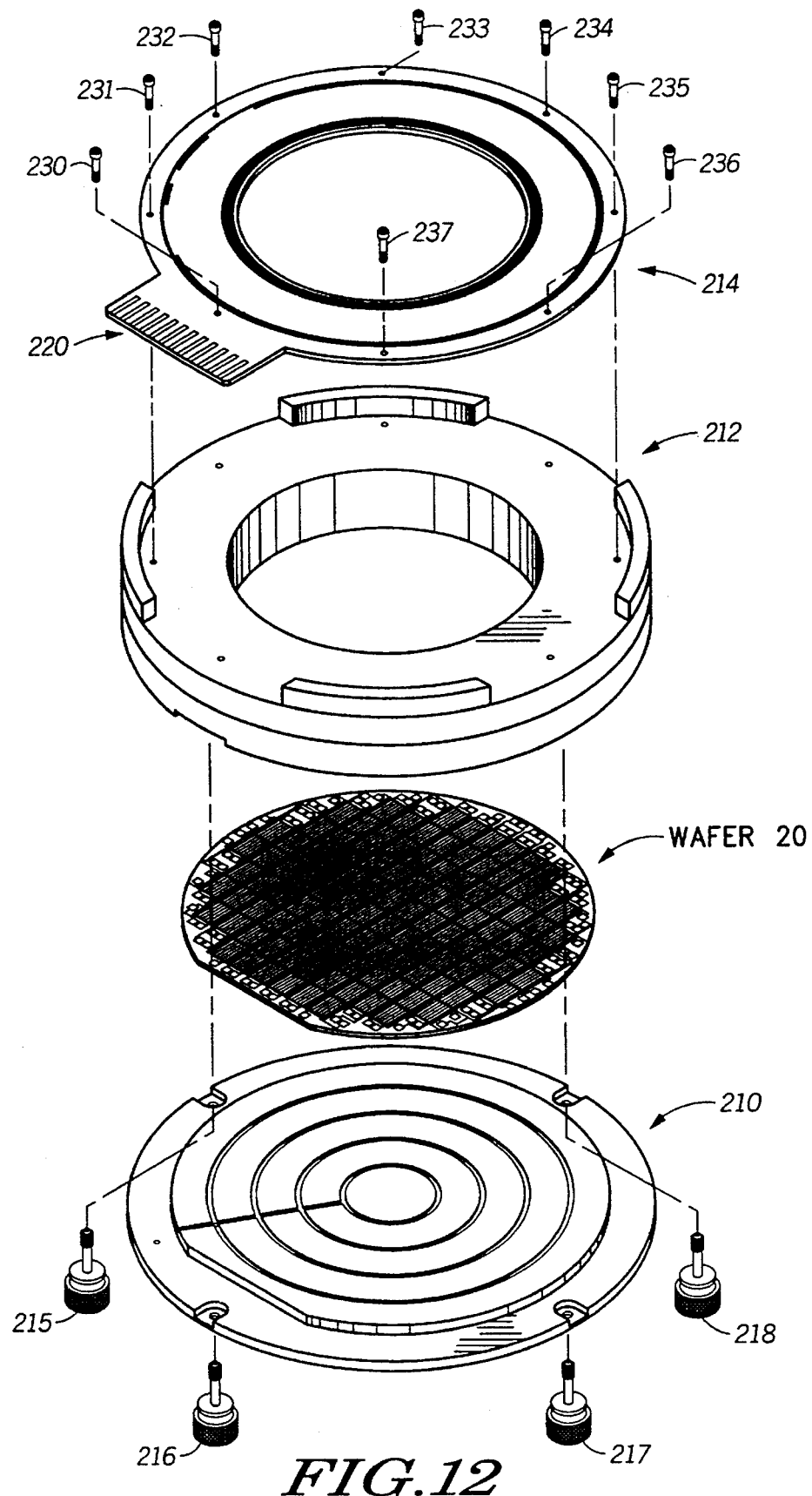
FIG. 12 illustrates a three-quarters, segmented view of the apparatus for performing wafer level testing of FIG. 9 in accordance with one embodiment of the present invention.

FIGS. 9–12 illustrate various views of an apparatus for performing wafer level testing in accordance with one embodiment of the present invention. FIG. 9 illustrates a test fixture 200 and a semiconductor wafer 20. Although FIG. 12 illustrates a view of test fixture 200 as it is used to perform wafer level burn-in, it is important to note that test fixture 200 is loaded upside down from the view illustrated in FIG. 12. That is, electrical connector board 214 is attached to top plate 212 and they are both flipped over. Then semiconductor wafer 20 is flipped over and placed against the bottom of top plate 212, with integrated circuit dice 22 facing downward toward top plate 212.

Then bottom plate 210 is flipped over and the top of bottom plate 210 is placed against the bottom of semiconductor wafer 20. Screws 215–218 are then tightened to hold test fixture 200 together. Test fixture 200 can then be flipped back over so that screws 215– 218 act as feet, as illustrated in FIG. 12. The wide, center opening in electrical connector board 214 and the wide, center opening in top plate 212 allow access to semiconductor wafer 20 during testing. For example, probe needles may make contact to wafer 20 through these openings.

Test fixture 200 will now be discussed in more detail. Top plate 212 has a leaf spring 247, a retaining screw 248, and a flat 249 which are used to align a semiconductor substrate such as wafer 20 (see cut-throughs in FIG. 10). Leaf spring 247 and retaining screw 248 are located so that they use the alignment point on the periphery of wafer 20 which is used during the processing steps for forming integrated circuit dice 22. Wafer 20 is placed on top plate 212 such that wafer flat 21 of wafer 20 fits up against flat 249 of top plate 212. In one embodiment of the present invention, retaining screw 248 holds leaf spring 247 in place.

Bottom plate 210 may optionally have concentric grooves, which can be used in conjunction with vacuum fitting 243 (see FIG. 10) to allow a vacuum to be drawn to hold wafer 20 firmly in contact with bottom plate 210. In addition, back pressure can be applied to vacuum fitting 243 in order to separate wafer 20 from bottom plate 210.

In some embodiments, top plate 212 may be a solid plate; and in other embodiments, top plate 212 may be ring-shaped plate with a hole in the middle. An electrical connector board 214 is attached to top plate 212 by way of small screws 230–237. During normal usage of test fixture 200, electrical connector board 214 remains attached to top plate 212 by way of small screws 230–237. Electrical connector board 214 has a male edge connector 220 which can be used to transfer electrical signals to and from test fixture 200. Screws 215–218 are used to physically hold together bottom plate 210, wafer 20, and top plate 212. Screws 215–218 must be unscrewed in order to remove a first wafer 20 and to replace it with a second wafer 20 which is to be tested.

Figure 10:
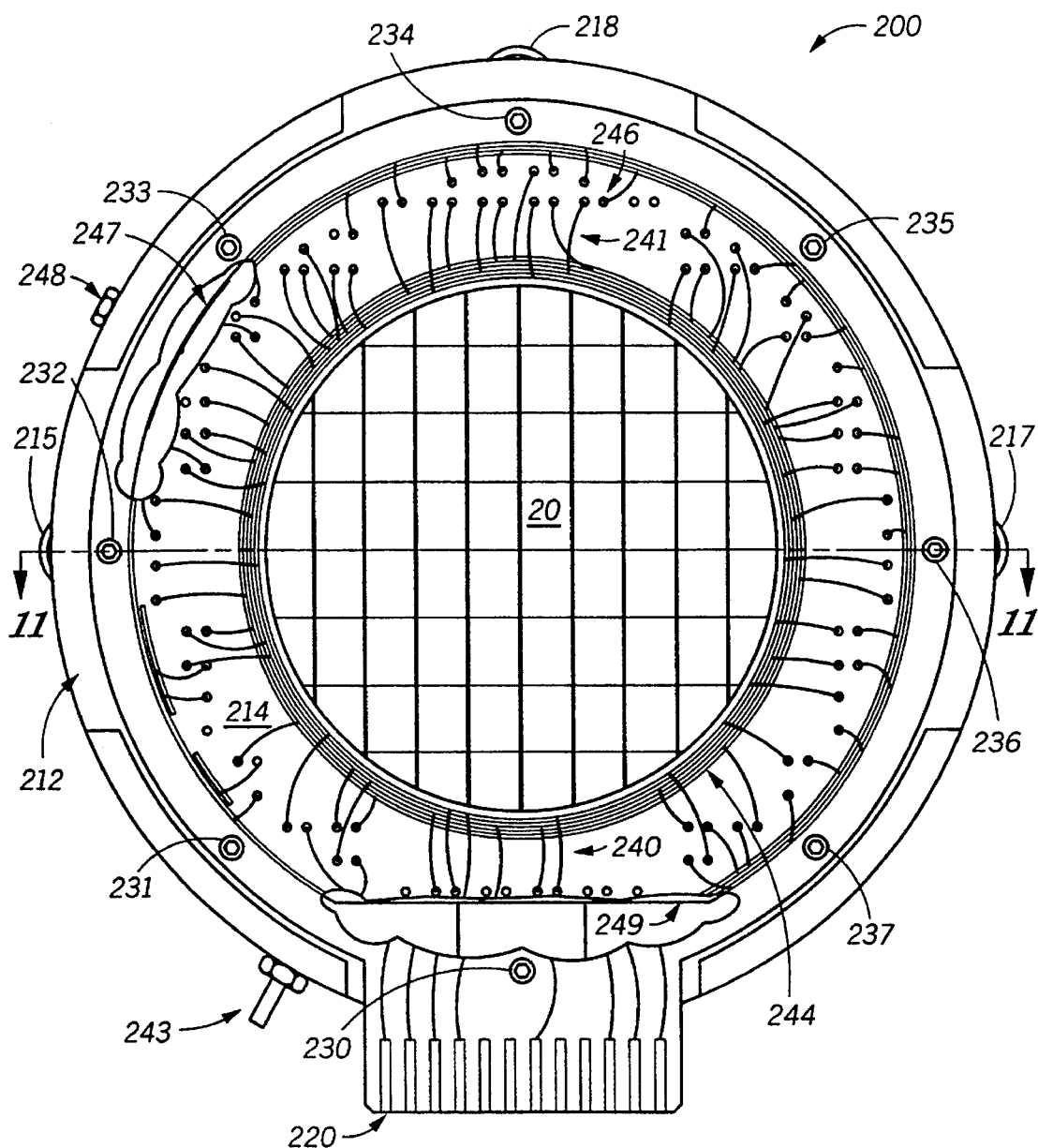
FIG. 10 illustrates a top view of the apparatus for performing wafer level testing of FIG. 9 in accordance with one embodiment of the present invention.
Figure 11:
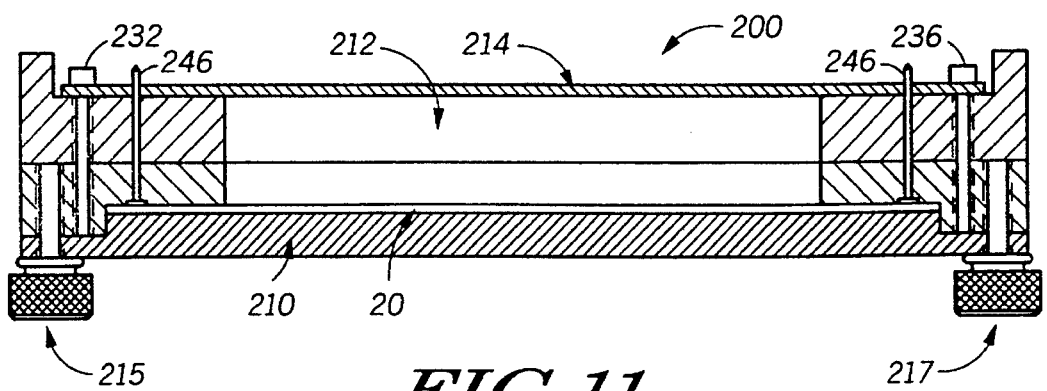
FIG. 11 illustrates a cross-sectional view of the apparatus for performing wafer level testing of FIG. 9 taken along the line 11—11 in accordance with one embodiment of the present invention.

Referring to FIG. 10, screwing down screws 215–218 causes pogo pins 246 to come in physical contact with the wafer contact pads 38 on wafer 20 (see FIG. 2). The illustrated embodiment of the present invention has a pogo pin 246 for each wafer contact pad 38. The physical placement of each pogo pin 246 in electrical connector board 214 corresponds to the physical placement of wafer contact pads 38 on wafer 20.

Each of the pogo pins 246 comes in physical contact with one of the wafer contact pads 38. As a result, each of the pogo pins 246 is electrically coupled to one of the wafer contact pads 38. Wires 241 electrically couple each pogo pin 246 to one of the conductors 244 on electrical connector board 214. Each of the conductors 244 on electrical connector board 214 is coupled to one of the conductors on male edge connector 220 by way of one or more wires 240. In alternate embodiments of the present invention, wires 240 and wires 241 may be implemented as conductors on a printed circuit board.

FIGS. 9–12 illustrate one embodiment of test fixture 200 and a semiconductor wafer 20. There are many alternate embodiments. For example, both the top plate 212 and the bottom plate 210 may be any shape. Although one embodiment of the present invention uses pogo pins 246 as conductive members to electrically couple test fixture 200 to the wafer contact pads 38 on wafer 20, any type of conductive members could be used.

In addition, bottom plate 210 may include or incorporate conductive members. For example, bottom plate 210 may have conductive members which electrically couple test fixture 200 to the bottom of wafer 20 in order to transfer a ground voltage level to integrated circuit dice 22. In some embodiments of the present invention, the electrical coupling between test fixture 200 and the bottom of wafer 20 may be the only way in which integrated circuit dice 22 receive a ground voltage level. In other embodiments of the present invention, the electrical coupling between test fixture 200 and the bottom of wafer 20 may be an additional way in which integrated circuit dice 22 receive a ground voltage level.

In addition, bottom plate 210 may include or incorporate a different mechanism for receiving electrical signals. Male edge connector 220 is just one possible implementation. Any alternate mechanism which allows electrical signals to be transferred to test fixture 200 from external to test fixture 200 may be used. Although one embodiment of the present invention uses electrical connector board 214 to electrically couple the pogo pins 246 to edge connector 220, any type of electrical coupling could be used. In an alternate embodiment of the present invention, wafer 20 itself may be patterned with edge connector conductors so that a female edge connector may be physically coupled directly to wafer 20.

In one embodiment of the present invention, bottom plate 210 is made of a material having a high coefficient of thermal conductance, and wafer 20 is held in close physical contact with bottom plate 210 by way of a vacuum. As a result, the temperature variation between each integrated circuit die 22 on wafer 20 is reduced.

Although one embodiment of the present invention uses screws 215–218 to couple top plate 212 and bottom plate 210, any mechanism which allows wafer 20 to be held in a fixed position relative to pogo pins 246 may be used.

Figure 13:
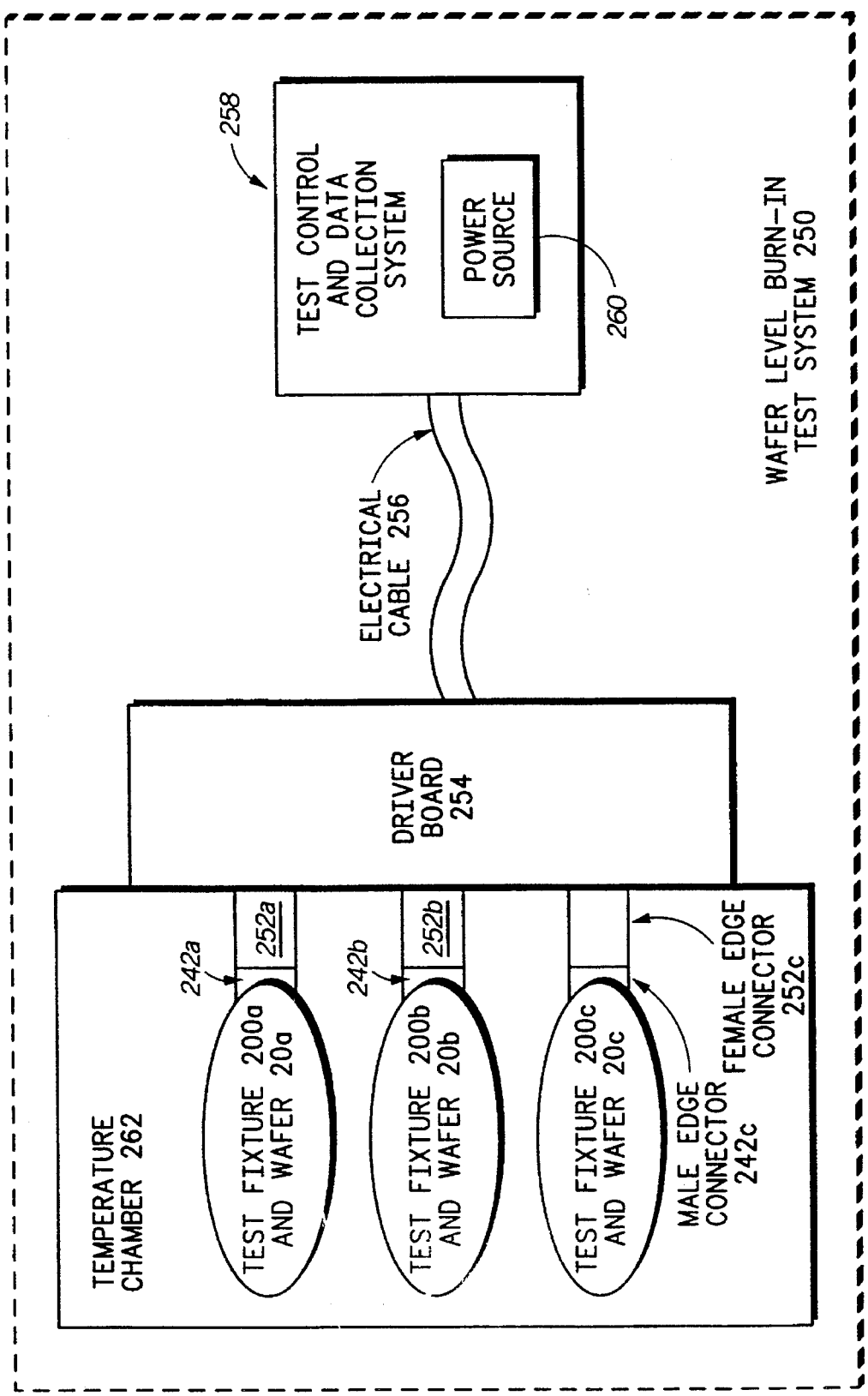
FIG. 13 illustrates, in block diagram form, a wafer level burn-in test system in accordance with one embodiment of the present invention.

FIG. 13 illustrates a wafer level burn-in test system 250 in accordance with one embodiment of the present invention. One or more test fixtures 200 and one or more semiconductor wafers 20 can be placed in temperature chamber 262. Although the embodiment of the present invention illustrated in FIG. 13 shows only three test fixtures and three wafers, namely test fixtures 200a, 200b, and 200c, and wafers 20a, 20b, and 20c, alternate embodiments of the present invention may use any size temperature chamber 262, and may place as few or as many test fixtures 200 and wafers 20 in temperature chamber 262 as desired.

In the embodiment of the present invention illustrated in FIG. 13, test fixture 200a has a male edge connector 242a which is physically and electrically connected to female edge connector 252a; test fixture 200b has a male edge connector 242b which is physically and electrically connected to female edge connector 252b; and test fixture 200c has a male edge connector 242c which is physically and electrically connected to female edge connector 252c. In one embodiment of the present invention, the female edge connectors 252a, 252b, and 252c are physically attached to an inside wall of the temperature chamber 262.

The conductors on the female edge connectors 252a, 252b, and 252c are electrically coupled to driver board 254. Driver board 254 is coupled to test control and data collection system 258 by way of electrical cable 256. Test control and data collection system 258 includes a power source 260 which can be used to supply selected voltage levels to wafers 20a–20c.

In the illustrated embodiment of the present invention, test control and data collection system 258 transfers voltage level signals such as power and ground to each integrated circuit die 22 on each wafer 20a–20c. For example, in one embodiment of the present invention, power source 260 supplies three voltage levels to each integrated circuit dice 22 on each wafer 20a–20c, namely a ground supply voltage level, a standard power supply voltage level, and a high voltage power supply voltage level.

In one embodiment of the present invention, the integrated circuit dice 22 are data processors which have on-board EEPROM (electrically erasable programmable read only memory). For example, referring to FIG. 3, integrated circuit die 28 may have an EEPROM circuit 81 and integrated circuit die 29 may have an EEPROM circuit 82.

The high voltage power supply voltage level is required in order to properly program, and thus in order to test, the on-board memory. In alternate embodiments of the present invention, power source 260 may supply fewer, more, or different voltage level signals to each integrated circuit die 22 on each wafer 20a–20c.

In addition, test control and data collection system 258 transfers one or more test related signals to each integrated circuit die 22 on each wafer 20a–20c. For example, in one embodiment of the present invention, test control and data collection system 258 supplies a reset signal, a clock signal, and a data signal to each integrated circuit die 22 on each wafer 20a–20c. In alternate embodiments of the present invention, test control and data collection system 258 may supply fewer, more, or different test related signals to each integrated circuit die 22 on each wafer 20a–20c.

Some embodiments of the present invention may not require the use of a temperature chamber 262. Instead, heat strips (not shown) for generating heat may be attached to bottom plate 210.

The present invention may use various testing techniques to test integrated circuit dice 22 on one or more wafers 20 simultaneously. Although one embodiment of the present invention uses three test signals and three voltage signals to test integrated circuit dice 22 on one or more wafers 20 simultaneously, alternate embodiments of the present invention may use fewer, more, or different signals. Generally, however, most testing techniques will use at least a power signal, a ground signal, and a test initiation signal such as reset.

It is generally desirable in the present invention to use a testing technique which does not require access to all of the signals which are internally coupled to one or more bonding pads on integrated circuit dice 22. For example, the thorough electrical testing which is performed on packaged integrated circuit dice in the prior art uses a test apparatus which is normally electrically coupled to every integrated circuit pin, and thus every bonding pad on each integrated circuit die 22. In the present invention, however, it is generally desirable to reduce the number of signals which must be used to test integrated circuit dice 22. Reducing the number of signals used to test integrated circuit dice 22 reduces the number of separate wafer conductors which must be routed around each wafer 20.

One embodiment of the present invention uses a built-in-self-test (BIST) capability which is incorporated into each integrated circuit dice 22. The present invention may use any of a number of built-in-self-test testing techniques which are well known in the art. Most built-in-self-test testing techniques require only a small number of signals which must be transferred to and/or from the integrated circuit.

For example, the MC68HC11 microcontroller (available from Motorola, Inc. of Austin, Tex.) has a bootstrap mode which can be used in conjunction with a serial communication interface to perform a built-in-self-test. The MC68HC11 bootstrap mode requires that the self-test software be loaded into the on-board random access memory (RAM) by means of the serial communication interface. Thus the MC68HC11 microcontroller is a data processor which has the capability to perform self-tests with only a few bonding pads coupled external to the data processor for receiving or transferring signals. Thus only a few wafer conductors would be required to perform wafer level testing of the MC68HC11 microcontroller.

The Intel 80486 microprocessor (available from Intel, Corp. of Santa Clara, Calif.) has a built-in-self-test capability which allows it to perform a built-in-self-test without the need for transferring any software. Thus the Intel 80486 microprocessor would require even fewer signals than the MC68HC11 bootstrap mode. There are other data processors which also have the capability to perform self-tests with only a few bonding pads coupled external to the data processor for receiving or transferring signals. For the data processors which have this self-test capability, only a few wafer conductors are required in order to test the individual data processor integrated circuit dice while they are still in wafer form.

In one embodiment of the present invention, integrated circuit dice 22 are data processors having on-board EEPROM 81, 82 (see FIG. 3). The EEPROM may be used to store test result information. For example, the EEPROM can be used to store information regarding whether or not the integrated circuit dice 22 passed or failed a built-in-self-test. In addition, if a failure occurred, one or more bytes of the EEPROM can be used to store more detailed information regarding the failure. For example, the EEPROM could be used to store information regarding the testing of the EEPROM itself. The EEPROM could store information regarding which portion of the test failed, which location or locations failed, whether or not the failure was a data retention failure, which write/erase cycle failed, etc.

A simple probe operation can be performed on the portion of the EEPROM used to store the test result information on each integrated circuit die 22. The probe operation can be used in order to determine whether or not each integrated circuit die 22 passed or failed the built-in-self-test.

Referring to FIG. 13, one embodiment of the present invention uses a built-in-self-test testing techniques which requires six signals, and thus six separate wafer conductors on each wafer 20. In one embodiment of the present invention, the six signals include a power supply high voltage level signal, a data signal, a reset signal, a clock signal, a power supply memory programming voltage level signal, and a power supply ground voltage level signal. Due to the higher currents they must conduct, the wafer conductors which are used to transfer power supply voltage levels are generally formed using wider conductors than the wafer conductors which are used to transfer test signals.

Referring to the power supply high voltage level signal, in one embodiment of the present invention, a power supply high voltage level signal is transferred from power source 260 to each integrated circuit die 22 on wafers 20a–20c. Referring to FIG. 2, wafer contact pad 54, and possibly one or more redundant wafer contact pads, receive this power supply high voltage level signal. This power supply high voltage level signal is then transferred to each individual integrated circuit die 22 by way of a wafer conductor.

A portion of the wafer conductor transferring the power supply high voltage level signal may overlie one or more integrated circuit dice 22. Referring to FIG. 2 and FIG. 3, in one embodiment of the present invention, the wafer conductor transferring the power supply high voltage level signal includes vertical conductor 42 and a horizontal conductor (not shown) which is located in the horizontal dicing lane adjacent to horizontal dicing lane 34 (in the direction away from wafer flat 21). Note that in one embodiment of the present invention, two horizontal conductors are formed in each horizontal dicing lane. Alternate embodiments of the present invention may form a different number of horizontal conductors in each horizontal dicing lane.

In some embodiments of the present invention there are six signals to be transferred for testing purposes. In one of these embodiments, every sixth horizontal conductor will be included as a portion of the wafer conductor which is transferring the power supply high voltage level signal. Likewise, every sixth vertical conductor will be included as a portion of the wafer conductor which is transferring the power supply high voltage level signal.

In an alternate embodiment of the present invention, extra vertical conductors are used for the signals transferring power and ground. For example, an integrated circuit die 22 may have eight overlying vertical conductors, where two of the eight vertical conductors are transferring a power signal and a different two of the eight vertical conductors are transferring a ground signal. Note that some of the horizontal conductors and some of the vertical conductors may be located in the dicing lanes rather than overlying the integrated circuit dice 22.

Referring to the data signal, in one embodiment of the present invention, a data signal is transferred from test control and data collection system 258 to each integrated circuit die 22 on wafers 20a–20c. Referring to FIG. 2, wafer contact pad 55, and possibly one or more redundant wafer contact pads, receive this data signal. This data signal is then transferred to each individual integrated circuit die 22 by way of a wafer conductor.

A portion of the wafer conductor transferring the data signal may overlie one or more integrated circuit dice 22. Referring to FIG. 2 and FIG. 3, in one embodiment of the present invention, the wafer conductor transferring the data signal includes vertical conductor 43 and horizontal conductor 53.

In some embodiments of the present invention there are six signals to be transferred for testing purposes. In one of these embodiments, every sixth horizontal conductor will be included as a portion of the wafer conductor which is transferring the data signal. Likewise, every sixth vertical conductor will be included as a portion of the wafer conductor which is transferring the data signal.

Referring to the reset signal, in one embodiment of the present invention, a reset signal is transferred from test control and data collection system 258 to each integrated circuit die 22 on wafers 20a–20c. Referring to FIG. 2, wafer contact pad 56, and possibly one or more redundant wafer contact pads, receive this reset signal. This reset signal is then transferred to each individual integrated circuit die 22 by way of a wafer conductor.

A portion of the wafer conductor transferring the reset signal may overlie one or more integrated circuit dice 22. Referring to FIG. 2 and FIG. 3, in one embodiment of the present invention, the wafer conductor transferring the reset signal includes vertical conductor 44 and horizontal conductor 51.

In some embodiments of the present invention there are six signals to be transferred for testing purposes. In one of these embodiments, every sixth horizontal conductor will be included as a portion of the wafer conductor which is transferring the reset signal. Likewise, every sixth vertical conductor will be included as a portion of the wafer conductor which is transferring the reset signal.

Referring to the clock signal, in one embodiment of the present invention, a clock signal is transferred from test control and data collection system 258 to each integrated circuit die 22 on wafers 20a–20c. Referring to FIG. 2, wafer contact pad 57, and possibly one or more redundant wafer contact pads, receive this clock signal. This clock signal is then transferred to each individual integrated circuit die 22 by way of a wafer conductor.

A portion of the wafer conductor transferring the clock signal may overlie one or more integrated circuit dice 22. Referring to FIG. 2 and FIG. 3, in one embodiment of the present invention, the wafer conductor transferring the clock signal includes vertical conductor 45 and horizontal conductor 52.

In some embodiments of the present invention there are six signals to be transferred for testing purposes. In one of these embodiments, every sixth horizontal conductor will be included as a portion of the wafer conductor which is transferring the clock signal. Likewise, every sixth vertical conductor will be included as a portion of the wafer conductor which is transferring the clock signal.

Referring to the power supply memory programming voltage level signal, in one embodiment of the present invention, a memory programming voltage level signal is transferred from power source 260 to each integrated circuit die 22 on wafers 20a–20c. Referring to FIG. 2, wafer contact pad 58, and possibly one or more redundant wafer contact pads, receive this memory programming voltage level signal. This memory programming voltage level signal is then transferred to each individual integrated circuit die 22 by way of a wafer conductor.

A portion of the wafer conductor transferring the memory programming voltage level signal may overlie one or more integrated circuit dice 22. Referring to FIG. 2 and FIG. 3, in one embodiment of the present invention, the wafer conductor transferring the memory programming voltage level signal includes vertical conductor 46 and horizontal conductor 50.

In alternate embodiments of the present invention, one or more additional voltage level signals, aside from power and ground, may be used. A memory programming voltage level signal is merely one example. Other examples are an analog-to-digital converter reference voltage signal, a high or low voltage mode select signal, a supply voltage signal for a voltage regulator, and a high voltage signal for non-volatile memory stress and/or margin tests. Alternate embodiments of the present invention may use one or more high or low voltage signals for testing circuitry on integrated circuit dice 22.

In some embodiments of the present invention there are six signals to be transferred for testing purposes. In one of these embodiments, every sixth horizontal conductor will be included as a portion of the wafer conductor which is transferring the memory programming voltage level signal. Likewise, every sixth vertical conductor will be included as a portion of the wafer conductor which is transferring the memory programming voltage level signal.

Referring to the power supply ground voltage level signal, in one embodiment of the present invention, a ground voltage level signal is transferred from power source 260 to each integrated circuit die 22 on wafers 20a–20c. Referring to FIG. 2, wafer contact pad 59, and possibly one or more redundant wafer contact pads, receive this ground voltage level signal. This ground voltage level signal is then transferred to each individual integrated circuit die 22 by way of a wafer conductor.

A portion of the wafer conductor transferring the ground voltage level signal may overlie one or more integrated circuit dice 22. Referring to FIG. 2 and FIG. 3, in one embodiment of the present invention, the wafer conductor transferring the ground voltage level signal includes vertical conductor 47 and a horizontal conductor (not shown) which is located in the horizontal dicing lane adjacent to horizontal dicing lane 34 (in the direction away from wafer flat 21).

In some embodiments of the present invention there are six signals to be transferred for testing purposes. In one of these embodiments, every sixth horizontal conductor will be included as a portion of the wafer conductor which is transferring the ground voltage level signal. Likewise, every sixth vertical conductor will be included as a portion of the wafer conductor which is transferring the ground voltage level signal.

In one embodiment of the present invention, the power supply high voltage level signal and the power supply ground voltage level signal are used to supply power and ground to integrated circuit dice 22. The power supply memory programming voltage level signal is used to supply a high voltage level used to program and/or erase non-volatile memory such as EPROM, flash EPROM, or EEPROM. The reset signal is used to place each of the integrated circuit dice 22 in a predetermined reset state. The data signal is be used by the test control and data collection system 258 to initiate the built-in-self-test procedure on each integrated circuit 22. The data signal may also be used by the integrated circuits 22 to indicate that the built-in-self-test procedure has been completed.

Alternately, the data signal may be used to transfer instructions from the test control and data collection system 258 to each integrated circuit die 22. These instructions may then be used by each integrated circuit die 22 to initiate particular tests. In addition, the data signal may be used to transfer information from each integrated circuit die 22 to the test control and data collection system 258. This information can then be used to determine which integrated circuit dice 22 failed one or more tests, and which tests were failed by which integrated circuit dice 22.

Burn-in testing can also be performed using a wafer level burn-in test system 250 such as that illustrated in FIG. 13. Burn-in testing involves the testing of integrated circuit dice 22 for an extended period of time while the temperature of the integrated circuit dice 22 is elevated above room temperature. In some cases, the heat generated by the integrated circuit dice 22 itself is sufficient to elevate the temperature of the integrated circuit dice 22. In other cases, the temperature of the integrated circuit dice 22 is raised by placing the integrated circuit dice 22 in temperature chamber 262 and elevating the temperature. Alternately, test fixture 200 itself may incorporate a heating element (not shown) which can elevate the temperature of the integrated circuit dice 22.

Alternately, instead of, or in addition to burn-in testing, cold temperature testing may be performed. Cold temperature testing involves the testing of integrated circuit dice 22 for an extended period of time while the temperature of the integrated circuit dice 22 is decreased below room temperature. The temperature of the integrated circuit dice 22 is decreased by placing the integrated circuit dice 22 in temperature chamber 262 and decreasing the temperature.

In summation, the present invention can be used to perform wafer level burn-in testing of integrated circuit dice. By performing reliability testing on integrated circuit dice while in wafer form, semiconductor manufacturers can detect and screen out potentially all defective dice right after the dice have been manufactured, rather than after costly packaging has been performed. In addition, by performing reliability testing on integrated circuit dice while in wafer form, semiconductor manufacturers can meet the requirements of multi-chip module (MCM) manufacturers by supplying "known good dice".

In addition, by using built-in-self-test, the present invention allows some parametric testing and all functional testing, including burn-in reliability testing, to be performed while the integrated circuit dice 22 are still in wafer form. Thus for some integrated circuit dice 22, it may be possible to entirely eliminate all probe testing using very costly probe equipment. In addition, for some integrated circuit dice 22, it may be possible to entirely eliminate the testing which must be performed on packaged integrated circuits using very costly test equipment.

In performing wafer level testing of integrated circuit dice, the present invention utilizes wafer conductors which are formed at least partially overlying the integrated circuit dice themselves. By using the wafer conductors to transfer signals to, and possibly from, the integrated circuit dice, it is possible to electrically test and burn-in the integrated circuit dice in wafer form.

One embodiment of the present invention has six separate wafer conductors for transferring six different test signals; and each of the six wafer conductors includes a plurality of horizontal conductors and a plurality of vertical conductors. Alternate embodiments of the present invention can couple wafer conductors to all, some, or only a few of the bonding pads on each integrated circuit die. Some embodiments of the present invention use built-in-self-test capabilities which are incorporated into each individual integrated circuit die.

By allowing wafer conductors to be formed overlying the integrated circuit dice, the entire area of a semiconductor wafer is now available for the routing of wafer conductors for wafer level testing. The present invention can still make use of the unused periphery of the die and the narrow dicing lanes; but in addition, the present invention can use the area overlying the integrated circuits, which is the vast majority of the area on most wafers.

It is to be understood, therefore, that this invention is not limited to the particular forms illustrated and that the appended claims cover all modifications that do not depart from the spirit and scope of this invention.

We claim:

1. A semiconductor wafer, comprising:

a semiconductor substrate having an upper major surface;

a plurality of integrated circuit dice having an upper surface, each of said plurality of integrated circuit dice having a first edge at the upper surface and having a second edge at the upper surface, said plurality of integrated circuit dice being formed on said semiconductor substrate in a plurality of rows separated by a plurality of row dicing lanes and in a plurality of columns separated by a plurality of column dicing lanes; and a first wafer conductor, the first wafer conductor having a first portion formed overlying a first one of the plurality of dice located in a first one of the plurality of columns wherein the first portion crosses both the first edge and the second edge of the first one of the plurality of dice, the first wafer conductor having a second portion formed in a first one of the plurality of row dicing lanes, and the first wafer conductor having a third portion formed overlying a second one of the plurality of dice located in a second one of the plurality of columns wherein the third portion crosses both the first edge and the second edge of the second one of the plurality of dice;

whereby electrical contact can be made to the first one of the plurality of dice and the second one of the plurality of dice by way of the first wafer conductor for providing a signal for purposes of testing.

2. A semiconductor wafer as in claim 1, wherein the semiconductor wafer further comprises:

a wafer contact pad formed on said semiconductor substrate, said wafer contact pad being coupled to said first wafer conductor.

3. A semiconductor wafer as in claim 2, wherein the semiconductor wafer further comprises:

a plurality of redundant wafer contact pads formed on said semiconductor substrate, said plurality of redundant wafer contact pads being coupled to said first wafer conductor.

4. A semiconductor wafer as in claim 2, wherein each of said plurality of integrated circuit dice comprises:

a predetermined number of bonding pads.

5. A semiconductor wafer as in claim 4, wherein fewer than said predetermined number of bonding pads on each of said plurality of integrated circuit dice are used for purposes of testing.

6. A semiconductor wafer as in claim 5, wherein each of the fewer than said predetermined number of bonding pads on each of said plurality of integrated circuit dice comprises:

a mini-pad contact.

7. A semiconductor wafer as in claim 4, wherein the semiconductor wafer further comprises:

a current limiting element having a first terminal coupled to said first wafer conductor and having a second terminal coupled to at least one of the predetermined number of bonding pads on the first one of the plurality of integrated circuit dice.

8. A semiconductor wafer as in claim 1, wherein each of said plurality of integrated circuit dice is a data processor.

9. A semiconductor wafer as in claim 8, wherein during testing, each data processor executes a plurality of data processor instructions.

10. A semiconductor wafer as in claim 7, wherein said current limiting element comprises:
   a resistor.

11. A semiconductor wafer as in claim 1, further comprising:
   a second wafer conductor;
   a first plurality of redundant wafer contact pads formed on said semiconductor substrate, said first plurality of redundant wafer contact pads being coupled to said first wafer conductor; and
   a second plurality of redundant wafer contact pads formed on said semiconductor substrate, said second plurality of redundant wafer contact pads being coupled to said second wafer conductor.

12. A semiconductor wafer as in claim 11, wherein said second wafer conductor supplies a test signal to said plurality of integrated circuit dice.

13. An apparatus for performing wafer level testing, comprising:
   a semiconductor substrate having an upper major surface;
   a plurality of integrated circuit dice having an upper surface, each of said plurality of integrated circuit dice having a first edge at the upper surface and having a second edge at the upper surface, said plurality of integrated circuit dice being formed on said semiconductor substrate and being separated by a plurality of dicing lanes, each of said plurality of integrated circuit dice having a plurality of bonding pads;
   a first plurality of wafer contact pads formed on said semiconductor substrate;
   a first wafer conductor coupled to said first plurality of wafer contact pads and coupled to a first predetermined one of the plurality of bonding pads on each of said plurality of integrated circuit dice, said first wafer conductor having a first linear segment running a full length of a first one of the plurality of dicing lanes, having a second linear segment running the full length of a second one of the plurality of dicing lanes, having a third linear segment overlying a first one of the plurality of dice wherein the third linear segment crosses both the first edge and the second edge of the first one of the plurality of dice, and having a fourth linear segment overlying a second one of the plurality of dice wherein the fourth linear segment crosses both the first edge and the second edge of the second one of the plurality of dice, wherein for the first wafer conductor the first linear segment is parallel to the second linear segment, the third linear segment is parallel to the fourth linear segment, and the first linear segment is perpendicular to the third linear segment;
   a second plurality of wafer contact pads formed on said semiconductor substrate; and
   a second wafer conductor coupled to said second plurality of wafer contact pads and coupled to a second predetermined one of the plurality of bonding pads on each of said plurality of integrated circuit dice, said second wafer conductor having a first linear segment running the full length of a third one of the plurality of dicing lanes, having a second linear segment running the full length of a fourth one of the plurality of dicing lanes, having a third linear segment overlying the first one of the plurality of dice wherein the third linear segment crosses both the first edge and the second edge of the first one of the plurality of dice, and having a fourth linear segment overlying the second one of the plurality of dice wherein the fourth linear segment crosses both the first edge and the second edge of the second one of the plurality of dice, wherein for the second wafer conductor the first linear segment is parallel to the second linear segment, the third linear segment is parallel to the fourth linear segment, and the first linear segment is perpendicular to the third linear segment.

14. An apparatus as in claim 13, wherein a first power supply voltage is applied to said first plurality of wafer contact pads, and a second power supply voltage is applied to said second plurality of wafer contact pads, in order to perform a test of the plurality of integrated circuit dice.

15. An apparatus as in claim 14, wherein the test is a burn-in test.

16. An apparatus as in claim 15, wherein each of said plurality of integrated circuit dice is a data processor.

17. An apparatus as in claim 14, wherein the apparatus further comprises:
   a third wafer contact pad formed on said semiconductor substrate;
   a third wafer conductor coupled to said third wafer contact pad and to said plurality of integrated circuit dice, said third wafer conductor being formed overlying the upper surface of at least one of the plurality of integrated circuit dice, said third wafer conductor conducting a reset signal;
   a fourth wafer contact pad formed on said semiconductor substrate;
   a fourth wafer conductor coupled to said fourth wafer contact pad and to said plurality of integrated circuit dice, said fourth wafer conductor being formed overlying the upper surface of the at least one of the plurality of integrated circuit dice, said fourth wafer conductor conducting a clock signal;
   a fifth wafer contact pad formed on said semiconductor substrate; and
   a fifth wafer conductor coupled to said fifth wafer contact pad and to said plurality of integrated circuit dice, said fifth wafer conductor being formed overlying the upper surface of the at least one of the plurality of integrated circuit dice, said fifth wafer conductor conducting a data signal.

18. An apparatus as in claim 17, wherein the apparatus further comprises:
   a sixth wafer contact pad formed on said semiconductor substrate; and
   a sixth wafer conductor coupled to said sixth wafer contact pad and to said plurality of integrated circuit dice, said sixth wafer conductor being formed overlying the upper surface of the at least one of the plurality of integrated circuit dice, said sixth wafer conductor conducting a third power supply voltage.

19. An apparatus as in claim 13, wherein the apparatus further comprises:
   a first plurality of resistive elements, each of said first plurality of resistive elements having a first electrode which is coupled to said first wafer conductor, and having a second electrode which is coupled to the first predetermined one of the plurality of bonding pads on each of said plurality of integrated circuit dice; and
   a second plurality of resistive elements, each of said second plurality of resistive elements having a first electrode which is coupled to said second wafer conductor, and having a second electrode which is coupled to the second predetermined one of the plurality of bonding pads on each of said plurality of integrated circuit dice.

20. An apparatus as in claim 13, wherein the first predetermined one of the plurality of bonding pads on each of said plurality of integrated circuit dice comprises:

a first mini-pad contact.

21. An apparatus as in claim 20, wherein the second predetermined one of the plurality of bonding pads on each of said plurality of integrated circuit dice comprises:

a second mini-pad contact.

22. An apparatus as in claim 13, wherein each of said plurality of integrated circuit dice comprises:

a storage circuit for storing test result information.

23. An apparatus as in claim 13, wherein each of said plurality of integrated circuit dice comprises:

a storage means for storing a value, the value representing a unique location on said semiconductor substrate, each of said plurality of integrated circuit dice otherwise being logically identical.

24. An apparatus as in claim 13, wherein the apparatus further comprises:

a test fixture;

said test fixture comprising:

a bottom plate for holding said semiconductor substrate;

a top plate;

coupling means for physically coupling the top plate to the bottom plate while said semiconductor substrate is held between the top plate and the bottom plate;

an edge connector coupled to one of the bottom and top plates;

first conductive means for electrically coupling said first wafer contact pad to the edge connector; and second conductive means for electrically coupling said second wafer contact pad to the edge connector.

25. An apparatus as in claim 24, wherein said first conductive means includes a first pin, said second conductive means includes a second pin, and said coupling means includes a plurality of screws.

26. A semiconductor wafer, comprising:

a semiconductor substrate having an upper major surface;

a plurality of integrated circuit dice being formed on said semiconductor substrate;

a bonding pad contact being formed on a first one of the plurality of integrated circuit dice, said bonding pad contact providing bonding contact to the first one of the plurality of integrated circuit dice after singulation of the semiconductor wafer;

a mini-pad contact being formed on the first one of the plurality of integrated circuit dice, said mini-pad contact being coupled to said bonding pad contact, said mini-pad contact providing bonding contact to the first one of the plurality of integrated circuit dice before singulation of the semiconductor wafer; and a wafer conductor, coupled to the first one of the plurality of integrated circuit dice by way of the mini-pad contact before singulation of the semiconductor wafer, the wafer conductor providing a signal to the first one of the plurality of integrated circuit dice in order to perform a test on the first one of the plurality of integrated circuit dice before singulation of the semiconductor wafer.

27. A semiconductor wafer as in claim 26, wherein the first one of the plurality of integrated circuit dice comprises:

a storage circuit for storing a result of the test performed on the first one of the plurality of integrated circuit dice.

28. A semiconductor wafer as in claim 27, wherein said storage circuit comprises:

at least one non-volatile memory cell.

29. A semiconductor wafer as in claim 27, wherein the result of the test includes a pass/fail indicator.

30. A semiconductor wafer as in claim 29, wherein the result of the test includes failure information when the pass/fail indicator indicates that the test failed.

31. A semiconductor wafer as in claim 30, wherein the failure information includes which portion of the test failed.

32. A semiconductor wafer as in claim 26, wherein the signal is a first power supply signal, and wherein the semiconductor wafer further comprises:

a second wafer conductor, coupled to the first one of the plurality of integrated circuit dice, said second wafer conductor providing a second power supply voltage to the first one of the plurality of integrated circuit dice before singulation of the semiconductor wafer; and a third wafer conductor, coupled to the first one of the plurality of integrated circuit dice, said third wafer conductor providing a test initiation signal to the first one of the plurality of integrated circuit dice, the test initiation signal initiating a test on the first one of the plurality of integrated circuit dice, the test being performed before singulation of the semiconductor wafer, the test producing a test result for the first one of the plurality of integrated circuit dice.

33. A semiconductor wafer as in claim 32, wherein the test initiation signal is a reset signal.

34. A semiconductor wafer as in claim 32, further comprising:

a fourth wafer conductor, coupled to the first one of the plurality of integrated circuit dice, said fourth wafer conductor providing a clock signal to the first one of the plurality of integrated circuit dice before singulation of the semiconductor wafer.

35. A semiconductor wafer as in claim 34, further comprising:

a fifth wafer conductor, coupled to the first one of the plurality of integrated circuit dice, said fifth wafer conductor providing a data signal to the first one of the plurality of integrated circuit dice before singulation of the semiconductor wafer.

36. A semiconductor wafer as in claim 35, further comprising:

a sixth wafer conductor, coupled to the first one of the plurality of integrated circuit dice, said sixth wafer conductor providing a third power supply voltage to the first one of the plurality of integrated circuit dice before singulation of the semiconductor wafer.

37. A semiconductor wafer as in claim 26, wherein the first one of the plurality of integrated circuit dice is a data processor.

38. A semiconductor wafer as in claim 26, wherein the test is a built-in-self-test.

39. A semiconductor wafer, comprising:

a semiconductor substrate having an upper major surface;

a plurality of data processors being formed on said semiconductor substrate; and a first wafer conductor, coupled to said plurality of data processors, said first wafer conductor providing a first power supply voltage to said plurality of data processors before singulation of the semiconductor wafer;

a second wafer conductor, coupled to said plurality of data processors, said second wafer conductor providing a second power supply voltage to said plurality of data processors before singulation of the semiconductor wafer;

a third wafer conductor, coupled to said plurality of data processors, said third wafer conductor providing a first signal to said plurality of data processors, the first signal initiating a test on each of said plurality of data processors, the test being performed before singulation of the semiconductor wafer, the test producing a test result on each of said plurality of data processors;

a fourth wafer conductor, coupled to said plurality of data processors, said fourth wafer conductor providing a second signal to said plurality of data processors before singulation of the semiconductor wafer;

a fifth wafer conductor, coupled to said plurality of data processors, said fifth wafer conductor providing a data signal to said plurality of data processors before singulation of the semiconductor wafer; and a sixth wafer conductor, coupled to said plurality of data processors, said sixth wafer conductor providing a third power supply voltage to said plurality of data processors before singulation of the semiconductor wafer;

wherein each of said plurality of data processors comprises:
at least one non-volatile memory cell for storing the test result.

40. A semiconductor wafer as in claim 39, wherein the result of the test includes a pass/fail indicator.

41. A semiconductor wafer as in claim 39, wherein the result of the test includes failure information when the pass/fail indicator indicates that the test failed.

42. A semiconductor wafer as in claim 41, wherein the failure information includes which portion of the test failed.

43. A semiconductor wafer as in claim 39, wherein the first signal is a reset signal.

44. A semiconductor wafer as in claim 39, wherein the second signal is a clock signal.

45. A semiconductor wafer as in claim 39, wherein each of said plurality of data processors has a unique identifier.

46. A semiconductor wafer as in claim 45, wherein each unique identifier for each of said plurality of data processors corresponds to a predetermined location on the semiconductor wafer.

* * * * *